United States Patent
Lin et al.

(10) Patent No.: US 11,430,788 B2
(45) Date of Patent: Aug. 30, 2022

(54) INTEGRATED CIRCUIT WITH LATCH-UP IMMUNITY

(71) Applicant: Taiwan Semiconductor Manufacturing Co., Ltd., Hsin-Chu (TW)

(72) Inventors: Jing-Yi Lin, Hsin-Chu (TW); Chih-Chuan Yang, Hsin-Chu (TW); Shih-Hao Lin, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 67 days.

(21) Appl. No.: 16/798,685

(22) Filed: Feb. 24, 2020

(65) Prior Publication Data
US 2021/0265346 A1 Aug. 26, 2021

(51) Int. Cl.
*H01L 27/092* (2006.01)
*H01L 27/02* (2006.01)
*H01L 21/8238* (2006.01)

(52) U.S. Cl.
CPC .. *H01L 27/0922* (2013.01); *H01L 21/823821* (2013.01); *H01L 27/0296* (2013.01)

(58) Field of Classification Search
CPC ............. H01L 27/0296; H01L 27/0922; H01L 21/8238
See application file for complete search history.

(56) References Cited

U.S. PATENT DOCUMENTS

| | | | | |
|---|---|---|---|---|
| 10,050,033 B1* | 8/2018 | Thei | ............... | H01L 21/823462 |
| 10,276,558 B1* | 4/2019 | Anderson | ........... | H01L 27/1211 |
| 2018/0308949 A1* | 10/2018 | Lin | ................ | H01L 21/823864 |
| 2019/0348415 A1* | 11/2019 | Sung | .................... | H01L 29/785 |
| 2020/0043927 A1* | 2/2020 | Wang | ............... | H01L 21/30625 |
| 2020/0279934 A1* | 9/2020 | Lin | ..................... | H01L 29/4908 |
| 2021/0066476 A1* | 3/2021 | Kao | ................. | H01L 29/66803 |
| 2021/0249530 A1* | 8/2021 | Yang | .................. | H01L 27/0886 |

* cited by examiner

*Primary Examiner* — Seahvosh Nikmanesh
(74) *Attorney, Agent, or Firm* — Eschweiler & Potashnik, LLC

(57) ABSTRACT

Various embodiments of the present disclosure are directed towards a method for forming an integrated chip. The method includes forming an epitaxial structure having a first doping type over a first portion of a semiconductor substrate. A second portion of the semiconductor substrate is formed over the epitaxial structure and the first portion of the semiconductor substrate. A first doped region having the first doping type is formed in the second portion of the semiconductor substrate and directly over the epitaxial structure. A second doped region having a second doping type opposite the first doping type is formed in the second portion of the semiconductor substrate, where the second doped region is formed on a side of the epitaxial structure. A plurality of fins of the semiconductor substrate are formed by selectively removing portions of the second portion of the semiconductor substrate.

20 Claims, 23 Drawing Sheets

INTEGRATED CIRCUIT WITH LATCH-UP IMMUNITY

BACKGROUND

The integrated circuit (IC) manufacturing industry has experienced exponential growth over the last few decades. As ICs have evolved, functional density (e.g., the number of interconnected devices per chip area) has increased while feature sizes have decreased. One advance by the semiconductor industry to scale down semiconductor devices is the development of fin field-effect transistors (FinFETs). While FinFETs have several advantages over traditional planar transistors (e.g., reduced power consumption, smaller feature sizes, etc.), the use of FinFETs in an IC does not come without problems.

One problem that may be exacerbated with an IC having FinFETs is the susceptibility of the IC to latch-up. Latch-up is an inadvertent creation of a low-impedance path in the IC due to one or more parasitic devices (e.g., a thyristor) being triggered. Latch-up may occur anywhere in the IC where a parasitic structure exists (e.g., a PNPN structure, which forms a thyristor, that is undesirably formed due to the relatively close proximity of two or more devices of the IC). A latch-up event may be triggered by various triggering events, such as solar flares, a voltage spike on an input terminal or output terminal of the IC, or the like. If a latch-up event is triggered, a large current may flow through the low-impedance path and cause the IC to malfunction and/or destroy the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
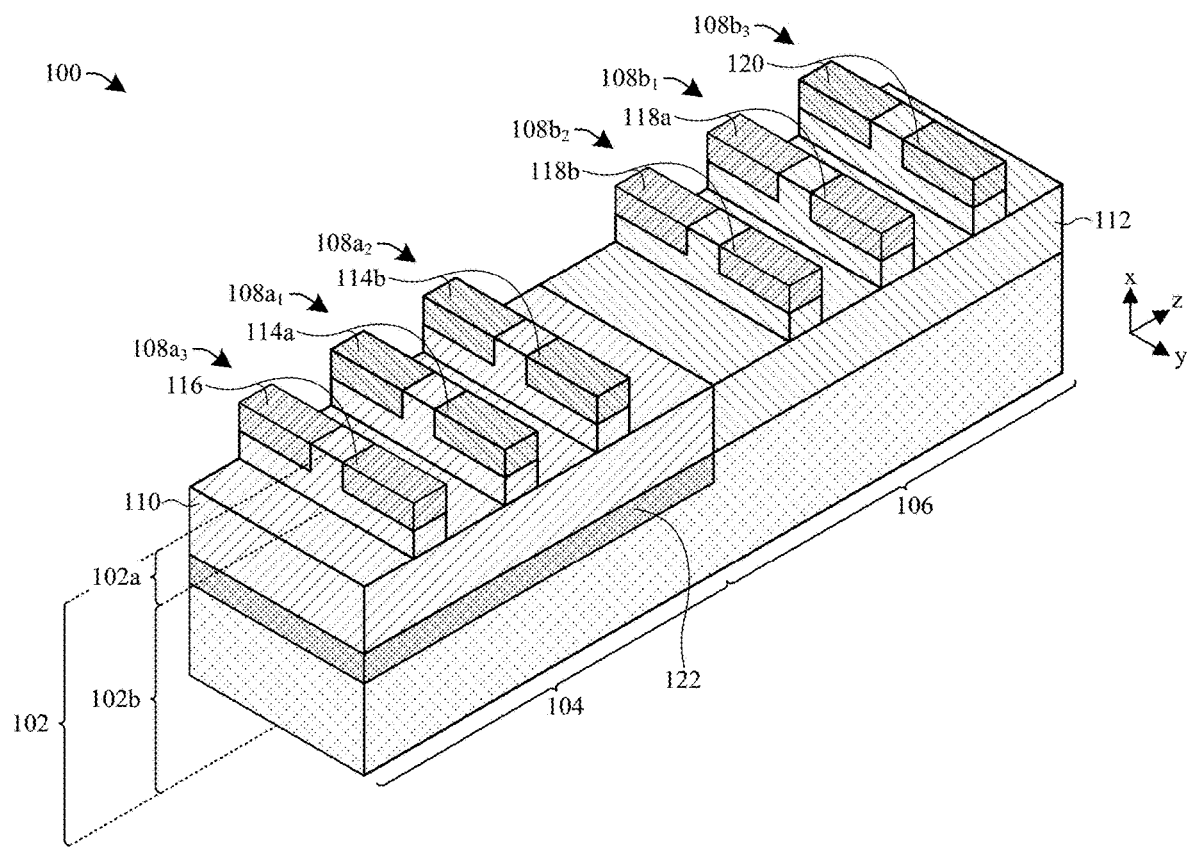
FIG. 1 illustrates an isometric view of some embodiments of an integrated chip (IC) having improved latch-up immunity.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an integrated chip (IC) comprises a n-channel metal-oxide-semiconductor field-effect transistor (MOSFET) and a p-channel MOSFET. Further, the IC comprises a doped region disposed in a semiconductor substrate. Typically, the semiconductor substrate has a first doping type (e.g., p-type), and the doped region has a second doping type opposite the first doping type (e.g., n-type). The p-channel MOSFET is disposed directly over the doped region, and the n-channel MOSFET is disposed directly over the semiconductor substrate and laterally spaced from the doped region. In further embodiments, the n-channel MOSFET may be a n-channel fin field-effect transistor (FinFET), and the p-channel MOSFET may be a p-channel FinFET. In yet further embodiments, the n-channel FinFET and the p-channel FinFET may be electrically coupled together to form a complementary metal-oxide-semiconductor (CMOS) device (e.g., a CMOS inverter).

Due to design considerations (e.g., functional density considerations resulting in relatively small spacing between the n-channel FinFET and the p-channel FinFET), the IC may have parasitic structures disposed in the semiconductor substrate. For example, a parasitic NPN bipolar junction transistor (BJT) is created by the junctions of a source/drain region of the n-channel FinFET (e.g., n-type), the semiconductor substrate, and the doped region. Further, a PNP BJT is created by the junctions of a source/drain region of the p-channel FinFET (e.g., p-type), the doped region, and the semiconductor substrate. The PNP BJT and the NPN BJT are connected together in such a way to create a first parasitic device in the semiconductor substrate (e.g., a thyristor comprising a PNPN structure).

During operation of the IC, the doped region and the source/drain of the p-channel FinFET may be coupled to a first voltage (e.g., Vdd, which may be, for example, 5 volts (V)), and the semiconductor substrate and the source/drain region of the n-channel FinFET may be coupled to a second voltage different than the first voltage (e.g., Vss, which may be, for example, ground). Under normal operating conditions, the first parasitic device is in an "OFF" state (e.g., no (or minimal) current flow through the thyristor), and the IC operates as intended.

However, a triggering event may occur (e.g., an inadvertent voltage spike in the IC) that causes the first parasitic device to switch to an "ON" state, thereby resulting in a latch-up event. During the latch-up event, a low-impedance path is formed that causes a large current to flow through the first parasitic device (e.g., between a Vdd terminal and a Vss terminal), thereby causing the IC to malfunction, or in some instances, destroy the IC. For the triggering event to cause the latch-up event, the triggering event must, at least in part, cause a voltage across the first parasitic device to reach (or exceed) a first latch-up trigger voltage. The latch-up trigger voltage is dependent on a resistance of the semiconductor substrate (e.g., substrate resistance) due to the substrate resistance affecting whether a base-emitter voltage of the NPN BJT is sufficient to forward bias the NPN BJT.

Various embodiments of the present application are directed toward an integrated chip (IC) with improved latch-up immunity. The IC comprises a first region and a second region. A n-channel FinFET is disposed over a semiconductor substrate and in the first region. A p-channel FinFET is disposed over the semiconductor substrate and in the second region. A first doped region is disposed in the semiconductor substrate and in the first region, where the first doped region has a first doping type (e.g., p-type). A second doped region is disposed in the semiconductor substrate and in the second region, where the second doped region has a second doping type opposite the first doping type (e.g., n-type). An epitaxial structure having the first doping type is disposed in the semiconductor substrate. The epitaxial structure is electrically coupled to the first doped region. The epitaxial structure is disposed in the first region and between the first doped region and a lower surface of the semiconductor substrate. The epitaxial structure has a higher doping concentration of first doping type dopants than the first doped region.

The IC may still have parasitic structures disposed in the semiconductor substrate. For example, the IC may comprise a second parasitic device created by the junctions of a source/drain of the p-channel FinFET, the second doped region, the first doped region, and a source/drain of the p-channel FinFET. As such, for a triggering event to cause a latch-up event, the triggering event must, at least in part, cause a voltage across the second parasitic device to reach (or exceed) a second latch-up trigger voltage. However, for the IC with improved latch-up immunity, the second latch-up trigger voltage is dependent on an equivalent resistance of a resistance of the epitaxial structure and a resistance of the first doped region, rather than just a substrate resistance (or just the resistance of the first doped region).

For example, because the epitaxial structure is electrically coupled to the first doped region, the second latch-up trigger voltage is dependent on the equivalent resistance of the resistance of the epitaxial structure and the resistance of the first doped region (e.g., due to the epitaxial structure being an additional current path in which charge carriers may flow into from the first doped region). Because the epitaxial structure is disposed between the first doped region and the lower surface of the semiconductor substrate, the equivalent resistance may be determined by modeling the epitaxial structure and the first doped region as two resistors coupled in parallel. Because the epitaxial structure has a higher doping concentration of first doping type dopants than the first doped region, the epitaxial structure has a lower resistance than the first doped region. Therefore, the equivalent resistance may be less than the substrate resistance (or less than a resistance of the first doped region). Thus, because the IC comprises the epitaxial structure, the second latch-up trigger voltage may be improved (e.g. increased) over the first latch-up trigger voltage. Accordingly, the IC may have improved latch-up immunity over an IC not comprising the epitaxial structure.

FIG. 1 illustrates an isometric view of some embodiments of an integrated chip (IC) having improved latch-up immunity.

As shown in FIG. 1, the IC 100 comprises a semiconductor substrate 102. The semiconductor substrate 102 may comprise any type of semiconductor body (e.g., monocrystalline silicon/CMOS bulk, silicon-germanium (SiGe), silicon carbide, etc.). The IC 100 comprises a first region 104 of the IC 100 and a second region 106 of the IC 100. The second region 106 of the IC 100 is disposed on a side of the first region 104 of the IC 100. In some embodiments, the first region 104 of the IC 100 is referred to as an NMOS region, and the second region 106 of the IC 100 is referred to as a PMOS region.

The semiconductor substrate 102 comprises a plurality of fins 108. Each of the fins 108 extend in parallel with one another (along the "y" direction). In some embodiments, the fins 108 are referred to as fins of the semiconductor substrate 102, respectively. A first set of fins 108a of the fins 108 are disposed in the first region 104 of the IC 100. A second set of fins 108b of the fins 108 are disposed in the second region 106 of the IC 100.

The fins 108 are laterally spaced from one another (in the "z" direction). Each of the fins 108 comprises a portion of an upper region 102a of the semiconductor substrate 102. The upper region 102a of the semiconductor substrate 102 extends vertically from a lower region 102b of the semiconductor substrate 102 (along the "x" direction). For example, a first fin $108a_1$ comprises a first portion of the upper region 102a of the semiconductor substrate 102 that extends vertically from the lower region 102b of the semiconductor substrate 102, and a second fin $108a_2$ comprises a second portion of the upper region 102a of the semiconductor substrate 102 that extends vertically from the lower region 102b of the semiconductor substrate 102.

A first doped region 110 is disposed in the semiconductor substrate 102 and in the first region 104 of the IC 100. In some embodiments, the first region 104 of the IC 100 is defined by a perimeter of the first doped region 110. In further embodiments, the first doped region 110 is disposed in the first set of fins 108a and disposed in a first portion of the lower region 102b of semiconductor substrate 102 that is disposed in the first region 104 of the IC 100.

A second doped region 112 is disposed in the semiconductor substrate 102 and in the second region 106 of the IC 100. The second doped region 112 is disposed on a side of the first doped region 110. In some embodiments, the second doped region 112 is disposed in the second set of fins 108b and disposed in a second portion of the lower region 102b of semiconductor substrate 102 that is disposed in the second region 106 of the IC 100. In further embodiments, the second region 106 of the IC 100 is defined by a perimeter of the second doped region 112.

The first doped region 110 has a first doping type (e.g., p-type). The second doped region 112 has a second doping type opposite the first doping type (e.g., n-type). The first doped region 110 has a first doping concentration of first doping type dopants (e.g., p-type dopants, such as boron atoms, aluminum atoms, or the like).

A pair of first source/drain regions 114 are disposed on/in some of the fins 108 of the first set of fins 108a. For example, a first pair 114a of the first source/drain regions 114 are disposed on/in the first fin $108a_1$, and a second pair 114b of the first source/drain regions 114 are disposed on/in the second fin $108a_2$. For clarity, only features (e.g., structural features, doping type, etc.) of the first pair 114a of the first source/drain regions 114 and/or features of the first fin $108a_1$ may be described below, however it will be appreciated that each pair of the first source/drain regions 114 and/or each fins 108 of the first set of fins 108a may comprise substantially similar features. For example, the first pair 114a of the first source/drain regions 114 may be regions of the first fin $108a_1$ having the second doping type. Thus, it will be appreciated that, the second pair 114b of the first source/drain regions 114 may be regions of the second fin $108a_2$ having the second doping type. In other embodiments, the first pair 114a of the first source/drain regions 114 may be epitaxial structures disposed on/in the first fin $108a_1$. In such embodiments, the epitaxial structures are a semiconductor material (e.g., epitaxial SiGe, epitaxial silicon carbide (SiC), or the like). In further such embodiments, the epitaxial structures disposed on/in the first fin $108a_1$ may have the second doping type.

A portion of the first fin $108a_1$ is disposed between the first pair 114a of the first source/drain regions 114. In some embodiments, the first doped region 110 is disposed in the portion of the first fin $108a_1$ that is disposed between the first pair 114a of the first source/drain regions 114. A first selectively-conductive channel is disposed in the portion of the first fin $108a_1$ that is disposed between the first pair 114a of the first source/drain regions 114. The first selectively-conductive channel extends between the first pair 114a of the first source/drain regions 114 (along the "y" direction). In further embodiments, the first pair 114a of the first source/drain regions 114 and the first selectively-conductive channel are part of an n-channel fin field-effect transistor (FinFET).

One or more first pick-up regions 116 are disposed on/in one or more of the fins of the first set of fins 108a. For example, the one or more first pick-up regions 116 are disposed on/in a third fin $108a_3$. The one or more first pick-up regions 116 may be regions of the third fin $108a_3$ having a same doping type as the first doped region 110. In other embodiments, the one or more first pick-up regions 116 may be epitaxial structures disposed on/in the third fin $108a_3$. In such embodiments, the epitaxial structures are a semiconductor material (e.g., epitaxial SiGe, epitaxial SiC, or the like). In further such embodiments, the epitaxial structures disposed on/in the third fin $108a_3$ may have the same doping type as the first doped region 110. The one or more first pick-up regions 116 provide a low resistance electrical connection between a first pick-up contact (not shown) (e.g., a metal contact) and the first doped region 110, such that the first doped region 110 may be electrically coupled (or biased) to a first voltage (e.g., Vss, which may be, for example, ground).

A pair of second source/drain regions 118 are disposed on/in some of the fins 108 of the second set of fins 108b. For example, a third pair 118a of the second source/drain regions 118 are disposed on/in a fourth fin $108b_1$, and a fourth pair 118b of the second source/drain regions 118 are disposed on a fifth fin $108b_2$. For clarity, only features (e.g., structural features, doping type, etc.) of the third pair 118a of the second source/drain regions 118 and/or features of the fourth fin $108b_1$ may be described, however it will be appreciated that each pair of the second source/drain regions 118 and/or each of the fins 108 of the second set of fins 108b may comprise substantially similar features. For example, the third pair 118a of the second source/drain regions 118 may be regions of the fourth fin $108b_1$ having the first doping type. Thus, it will be appreciated that, the fourth pair 118b of the second source/drain regions 118 may be regions of the fifth fin $108b_2$ having the first doping type. In other embodiments, the third pair 118a of the second source/drain regions 118 may be epitaxial structures disposed on/in the fourth fin $108b_1$. In such embodiments, the epitaxial structures are a semiconductor material (e.g., epitaxial SiGe, epitaxial SiC, or the like). In further such embodiments, the epitaxial structures disposed on/in the fourth fin $108b_1$ may have the first doping type.

A portion of the fourth fin $108b_1$ is disposed between the third pair 118a of the second source/drain regions 118. In some embodiments, the second doped region 112 is disposed in the portion of the fourth fin $108b_1$ that is disposed between the third pair 118a of the second source/drain regions 118. A second selectively-conductive channel is disposed in the portion of the fourth fin $108b_1$ that is disposed between the third pair 118a of the second source/drain regions 118. The second selectively-conductive channel extends between the third pair 118a of the second source/drain regions 118 (along the "y" direction). In further embodiments, the third pair 118a of the second source/drain regions 118 and the second selectively-conductive channel are part of an p-channel FinFET.

One or more second pick-up regions 120 are disposed on/in one or more of the fins 108 of the second set of fins 108b. For example, the one or more second pick-up regions 120 are disposed on/in a sixth fin $108b_3$. The one or more second pick-up regions 120 may be regions of the sixth fin $108b_3$ having a same doping type as the second doped region 112. In other embodiments, the one or more second pick-up regions 120 may be epitaxial structures disposed on/in the sixth fin $108b_3$. In such embodiments, the epitaxial structures are a semiconductor material (e.g., epitaxial SiGe, epitaxial SiC, or the like). In further such embodiments, the epitaxial structures disposed on/in the sixth fin $108b_3$ may have the same doping type as the second doped region 112. The one or more second pick-up regions 120 provide a low resistance electrical connection between a second pick-up contact (not shown) (e.g., a metal contact) and the second doped region 112, such that the second doped region 112 may be electrically coupled (or biased) to a second voltage (e.g., Vdd, which may be, for example, 5 volts (V)).

A first epitaxial structure 122 is disposed in the semiconductor substrate 102 and in the first region 104 of the IC 100. The first epitaxial structure 122 is a semiconductor material. The first epitaxial structure 122 may be, for example, epitaxial silicon, epitaxial germanium, epitaxial SiGe, some other semiconductor material grown by an epitaxial process, or a combination of the foregoing. In some embodiments, the first epitaxial structure 122 and the semiconductor substrate 102 are the same semiconductor material. For example, the first epitaxial structure 122 may be silicon, and the semiconductor substrate 102 may be silicon. In further embodiments, the first epitaxial structure 122 may have a same crystalline structure as the semiconductor substrate 102. For example, the first epitaxial structure 122 may be monocrystalline silicon, and the semiconductor substrate 102 may be monocrystalline silicon.

The first epitaxial structure 122 is disposed between the first doped region 110 and a lower surface of the semiconductor substrate 102. The first epitaxial structure 122 is disposed on a side of the second doped region 112. The first epitaxial structure 122 has the first doping type. The first epitaxial structure 122 is electrically coupled to the first doped region 110 (e.g., due to the first epitaxial structure 122, the first doped region 110, and/or portions of the substrate extending between the first epitaxial structure 122 and the first doped region 110 each having the first doping type).

The first epitaxial structure 122 has a second doping concentration of the first doping type dopants. The second doping concentration is greater than the first doping concentration. Because the second doping concentration is greater than the first doping concentration, a resistance (e.g., sheet resistance) of the first epitaxial structure 122 is lower than a resistance of the first doped region 110. In some embodiments, the first epitaxial structure 122 is electrically coupled to the first voltage. In further embodiments, the first epitaxial structure 122 may be electrically coupled to the first voltage via the first doped region 110 and the one or more first pick-up regions 116. In other embodiments, the first epitaxial structure 122 may be electrically coupled to the first voltage via a third pick-up contact (not shown) (e.g., a metal contact) that is disposed over the semiconductor substrate 102. In further such embodiments, one or more third pick-up regions (not shown) having the first doping type may be disposed in the semiconductor substrate 102 and contact the first epitaxial structure 122, such that the one or more third pick-up regions may provide a low resistance path between the one or more third pick-up regions and the first epitaxial structure 122.

Figure 2:
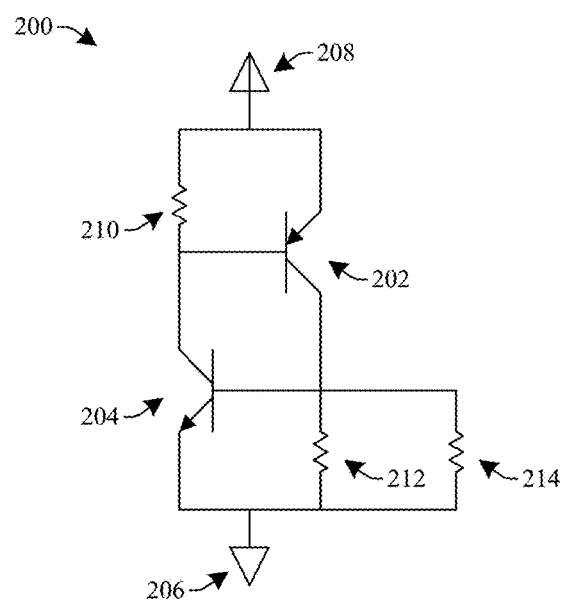
FIG. 2 illustrates a circuit diagram of some embodiments of an electrical circuit comprising a parasitic device of the IC of FIG. 1.

FIG. 2 illustrates a circuit diagram 200 of some embodiments of an electrical circuit comprising a parasitic device of the IC 100 of FIG. 1.

As shown in FIG. 2, the circuit diagram 200 comprises a PNP bipolar junction transistor (BJT) 202. The PNP BJT 202 is created by junctions between one of the second source/drain regions 118, the second doped region 112, and the first doped region 110 (see, e.g., FIG. 1). Further, the circuit diagram 200 comprises a NPN BJT 204 that is created by one of the first source/drain regions 114, the first doped region 110, and the second doped region 112 (see, e.g., FIG. 1). The PNP BJT 202 and the NPN BJT 204 are connected together in such a way as to create a parasitic device (e.g., thyristor).

The emitter of the NPN BJT 204, the base of the NPN BJT 204, and the collector of the PNP BJT 202 are electrically coupled to a first voltage node 206. The first voltage node 206 may have the first voltage (e.g., Vss, which may be, for example, ground). The emitter of the PNP BJT 202, the base of the PNP BJT 202, and the collector of the NPN BJT 204 are electrically coupled to a second voltage node 208. The second voltage node 208 may have the second voltage (e.g., Vdd, which may be, for example, 5 V).

The circuit diagram 200 comprises a first resistor 210, a second resistor 212, and a third resistor 214. The first resistor 210 represents a resistance of the second doped region 112. The second resistor 212 represents a resistance of the first doped region 110. The third resistor 214 represents a resistance of the first epitaxial structure 122.

Under normal operating conditions, the parasitic device is in an "OFF" state (e.g., no (or minimal) current flow through the thyristor). However, a triggering event may occur (e.g., an inadvertent voltage spike in the IC 100) that causes the parasitic device to switch to an "ON" state, thereby resulting in a latch-up event. During the latch-up event, a low-impedance path is formed that causes a large current to flow through the parasitic device (e.g., between Vdd terminal and Vss terminal), thereby causing the IC 100 to malfunction, or in some instances, destroy the IC 100.

For the triggering event to cause the latch-up event, the triggering event must, at least in part, cause a voltage across the parasitic device to reach (or exceed) a latch-up trigger voltage. As can be seen in the circuit diagram 200, the latch-up trigger voltage is dependent on a resistance of the second resistor 212 and a resistance of the third resistor 214 (e.g., due to the resistance of the second resistor 212 and a resistance of the third resistor 214 affecting whether a base-emitter voltage of the NPN BJT 204 is sufficient to forward bias the NPN BJT 204). In other words, the latch-up trigger voltage is dependent on a resistance of the first doped region 110 and a resistance of the first epitaxial structure 122.

As discussed above, the resistance of the first epitaxial structure 122 is less than a resistance of the first doped region 110. Therefore, an equivalent resistance of the resistance of the first doped region 110 and the resistance of the first epitaxial structure 122 is less than the resistance of the first doped region 110 (e.g., due to the second resistor 212 and the third resistor 214 being arranged in parallel). Thus, because the IC 100 comprises the first epitaxial structure 122 (see, e.g., FIG. 1), the latch-up trigger voltage of the IC 100 may be improved (e.g., increased) over an IC not comprising the first epitaxial structure 122. Accordingly, the IC 100 may have improved latch-up immunity (e.g., due to the improved latch-up trigger voltage preventing malfunctioning (and/or destruction) of the IC 100). In some embodiments, the latch-up trigger voltage of the IC 100 may be, on average, at least 50 millivolts (mV) greater than a latch-up trigger voltage of an IC not comprising the first epitaxial structure 122.

Figure 3:
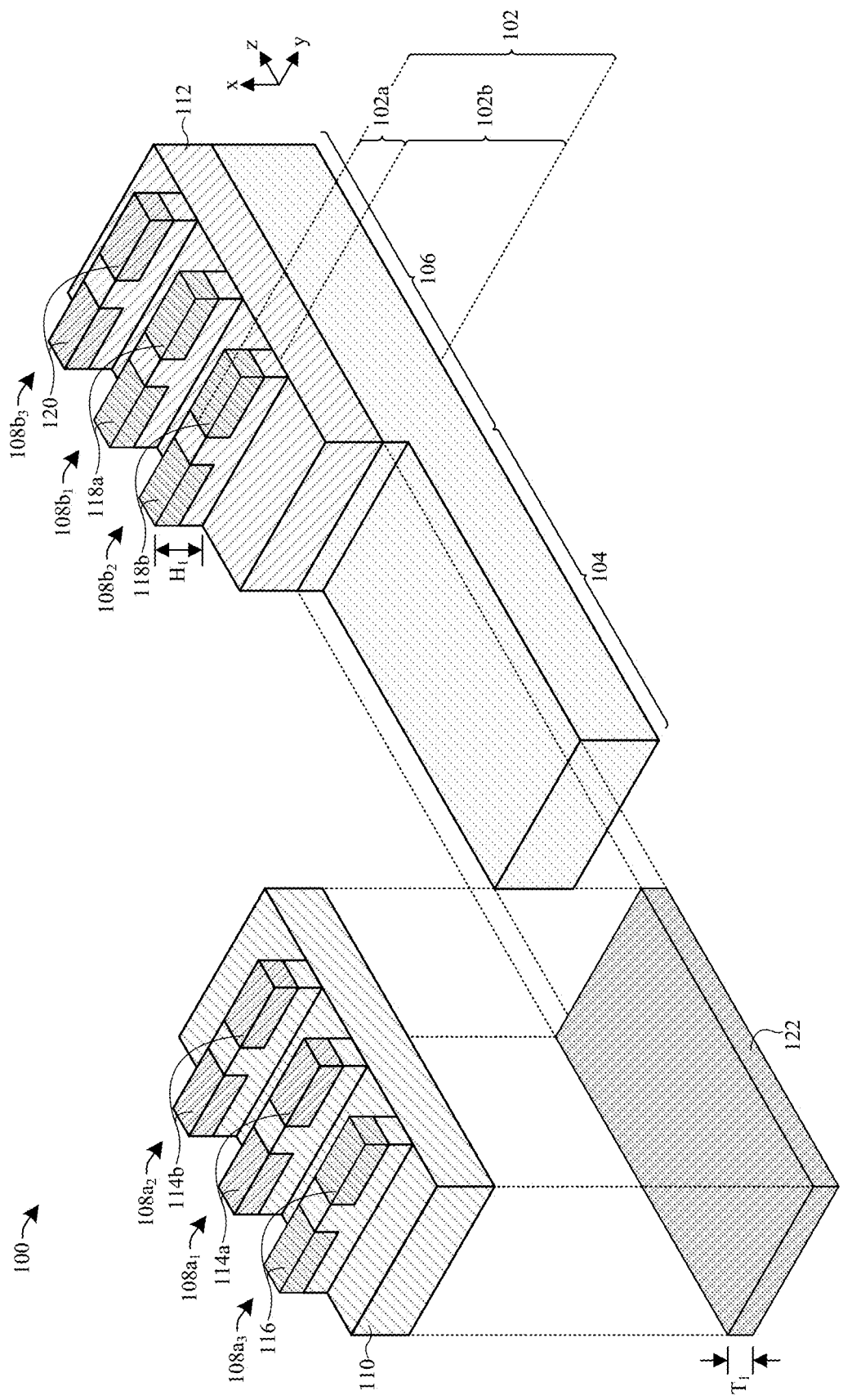
FIG. 3 illustrates an isometric view of some embodiments of the IC of FIG. 1

FIG. 3 illustrates an isometric view of some embodiments of the IC 100 of FIG. 1 partially deconstructed. FIG. 3 illustrates the IC 100 of FIG. 1 as partially deconstructed due to the first epitaxial structure 122 being separated from the semiconductor substrate 102 and features overlying the first epitaxial structure 122 (e.g., the first doped region 110, the first set of fins 108a, the first source/drain regions 114, and the one or more first pick-up regions 116) being separated from the first epitaxial structure 122.

As shown in FIG. 3, the first epitaxial structure 122 may extend continuously under the first doped region 110. In some embodiments, the first epitaxial structure 122 may extend continuously under each of the fins 108 of the first set of fins 108a. A sidewall of the first epitaxial structure 122 may be disposed between the first set of fins 108a and the second set of fins 108b. In further embodiments, the sidewall of the first epitaxial structure 122 may be disposed between the second fin 108$a_2$ and the fifth fin 108$b_2$. The second fin 108$a_2$ may be the nearest fin of the first set of fins 108a disposed next to the fifth fin 108$b_2$, and/or vice versa. In further embodiments, the sidewall of the first epitaxial structure 122 may be substantially aligned with a first side of the first doped region 110. In yet further embodiments, the sidewall of the first epitaxial structure 122 may be substantially aligned with a first side of the second doped region 112.

The first epitaxial structure 122 is disposed beneath the first doped region 110. In some embodiments, the first epitaxial structure 122 is disposed directly beneath the first doped region 110. The first epitaxial structure 122 may contact the first doped region 110. In further embodiments, an upper surface of the first epitaxial structure 122 may contact a lower side of the first doped region 110. In yet further embodiments, the lower side of the first doped region 110 may continuously contact the upper surface of the first epitaxial structure 122 across the entire upper surface of the first epitaxial structure 122.

In some embodiments, the first epitaxial structure 122 is disposed beneath the second doped region 112. In further embodiments, a perimeter of the first epitaxial structure 122 is disposed outside a perimeter of the second doped region 112, and vice versa. The first epitaxial structure 122 may be spaced from the second doped region 112. In other embodiments, the first epitaxial structure 122 may contact the first side of the second doped region 112. In further embodiments, the upper surface of the first epitaxial structure 122 is substantially aligned with a lower side of the second doped region 112. In other embodiments, the lower side of the second doped region 112 is disposed over the upper surface of the first epitaxial structure 122. In yet further embodiments, the lower side of the first doped region 110 may be substantially aligned with the lower side of the second doped region 112.

A width of the first doped region 110 and a width of the first epitaxial structure 122 may be substantially the same. In other embodiments, the width of the first epitaxial structure 122 may be less than the width of the first doped region 110. In yet other embodiments, the width of the first epitaxial structure 122 may be greater than the width of the first doped region 110. A length of the first doped region 110 and a length of the first epitaxial structure 122 may be substantially the same. In other embodiments, the length of the first epitaxial structure 122 may be less than the length of the first doped region 110. In yet other embodiments, the length of the first epitaxial structure 122 may be greater than the length of the first doped region 110.

The first epitaxial structure 122 has a first thickness $T_1$. The first thickness $T_1$ may be less than or equal to 3 micrometers (um). In some embodiments, the first thickness $T_1$ is between 1 um and 3 um. The fins 108 have a first height $H_1$. The first height $H_1$ may be less than or equal to 100 nanometers (nm). In some embodiments, the first height $H_1$ is between 50 nm and 100 nm. A ratio of the first height $H_1$ to the first thickness $T_1$ may be between 1:10 and 1:600. If the ratio of the first height $H_1$ to the first thickness $T_1$ is smaller than 1:10, latch-up immunity of the IC 100 is not sufficiently improved (e.g., due to the first thickness $T_1$ not being large enough to reduce the resistance of the first epitaxial structure 122 to sufficiently improve the latch-up immunity of the IC 100) or issues during fabrication arise (e.g., collapsing of the fins 108 due to physical limitations of the semiconductor substrate 102 material); if the ratio is greater than 1:600, the manufacturing costs increase without significant improvement. In further embodiments, the ratio of the first height $H_1$ to the first thickness $T_1$ is between 1:10 and 1:60. If the ratio of the first height $H_1$ to the first thickness $T_1$ is smaller than 1:10, latch-up immunity of the IC 100 is not sufficiently improved (e.g., due to the first thickness $T_1$ not being large enough to reduce the resistance of the first epitaxial structure 122 to sufficiently improve the latch-up immunity of the IC 100) or issues during fabrication arise (e.g., collapsing of the fins 108 due to physical limitations of the semiconductor substrate 102 material); if the ratio is greater than 1:60, the manufacturing costs increase without significant improvement.

The first doped region 110 has the first doping concentration of the first doping type dopants, and the first epitaxial structure 122 has the second doping concentration of the first doping type dopants. The second doping concentration is greater than the first doping concentration. In some embodiments, the first doping concentration of the first doping type dopants is less than or equal to $1 \times 10^{15}$ cm$^{-3}$ (e.g., atoms/cm$^3$). In further embodiments, the second doping concentration of the first doping type dopants is greater than or equal to $1 \times 10^{16}$ cm$^{-3}$. The second doping concentration of the first doping type dopants may be between $1 \times 10^{16}$ cm$^{-3}$ and $1 \times 10^{18}$ cm$^{-3}$.

A ratio of the second doping concentration of the first doping type dopants to the first doping concentration of the first doping type dopants may be between 10:1 and 1000:1. If the ratio of the second doping concentration to the first doping concentration is less than 10:1, latch-up immunity of the IC 100 is not sufficiently improved (e.g., due to the resistance of the first epitaxial structure 122 not being sufficiently less than the resistance of the first doped region 110 to improve the latch-up immunity of the IC 100); if the ratio of the second doping concentration to the first doping concentration is greater than 1000:1, latch-up immunity of the IC 100 is not sufficiently improved (e.g., due to the resistance of the first epitaxial structure 122 not being sufficiently different than the resistance of the first doped region 110 to improve the latch-up immunity of the IC 100). In further embodiments, the ratio of the second doping concentration of the first doping type dopants to the first doping concentration of the first doping type dopants may be between 10:1 and 100:1. If the ratio of the second doping concentration to the first doping concentration is less than 10:1, latch-up immunity of the IC 100 is not sufficiently improved (e.g., due to the resistance of the first epitaxial structure 122 not being sufficiently less than the resistance of the first doped region 110 to improve the latch-up immunity of the IC 100); if the ratio of the second doping concentration to the first doping concentration is greater than 100:1, latch-up immunity of the IC 100 is not sufficiently improved (e.g., due to the resistance of the first epitaxial structure 122 not being sufficiently different than the resistance of the first doped region 110 to improve the latch-up immunity of the IC 100). The first doping type dopants may be, for example, boron atoms, aluminum atoms, some other p-type dopant atoms, or a combination of the foregoing. In yet further embodiments, the first doping type dopants are boron atoms.

In some embodiments, portions of the semiconductor substrate 102 that are not labeled (e.g., not labeled as the first doped region 110, the second doped region 112, the one or more first pick-up regions 116, the one or more second pick-up regions 120, first source/drain regions 114, or the second source/drain regions 118) may have the first doping type. In further embodiments, the portions of the semiconductor substrate 102 that are not labeled have a third doping concentration of the first doping type dopants. The third doping concentration is less than the second doping concentration. In further embodiments, the third doping concentration of the first doping type dopants is less than or equal to $1 \times 10^{15}$ cm$^{-3}$. In yet further embodiments, the third doping concentration of the first doping type dopants may be the same as the first doping concentration of the first doping type dopants.

The first epitaxial structure 122 has a first sheet resistance. In some embodiments, the first sheet resistance is less than or equal to 1.2 ohms/sq. The first sheet resistance may be between 0.8 ohm/sq and 1.2 ohm/sq. The first doped region 110 has a second sheet resistance. The first sheet resistance is less than the second sheet resistance. In some embodiments, the second sheet resistance may be greater than or equal to 8 ohm/sq. The second sheet resistance may be between 8 ohm/sq and 12 ohm/sq. In further embodiments, the first sheet resistance is an order of magnitude less than the second sheet resistance. In yet further embodiments, the portions of the semiconductor substrate 102 that are not labeled may have a third sheet resistance. The third sheet resistance may be the same as the second sheet resistance.

Figure 4A:
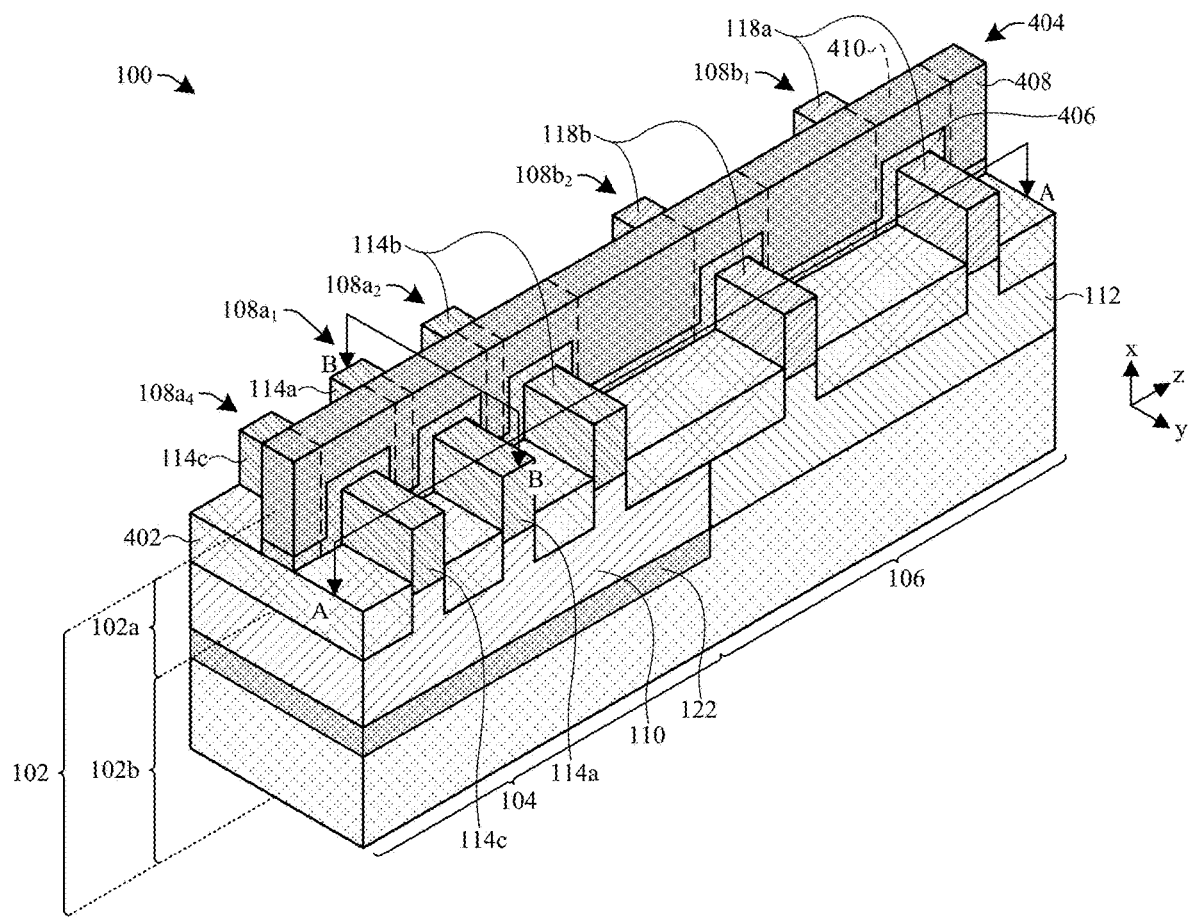
FIGS. 4A-4C illustrate various views of some other embodiments of the IC of FIG. 1.
Figure 4B:
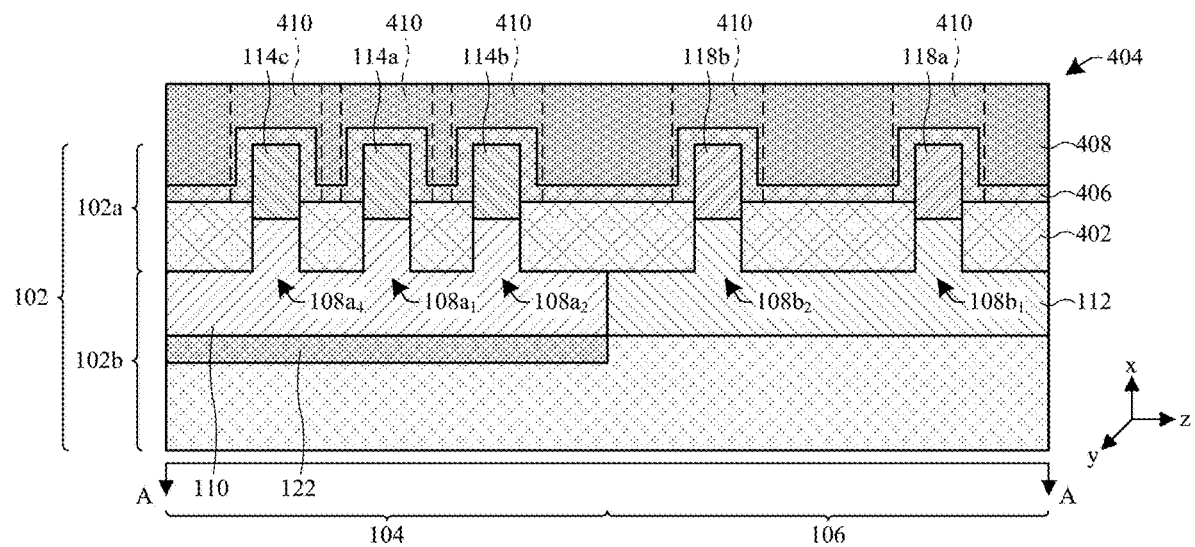
Figure 4C:
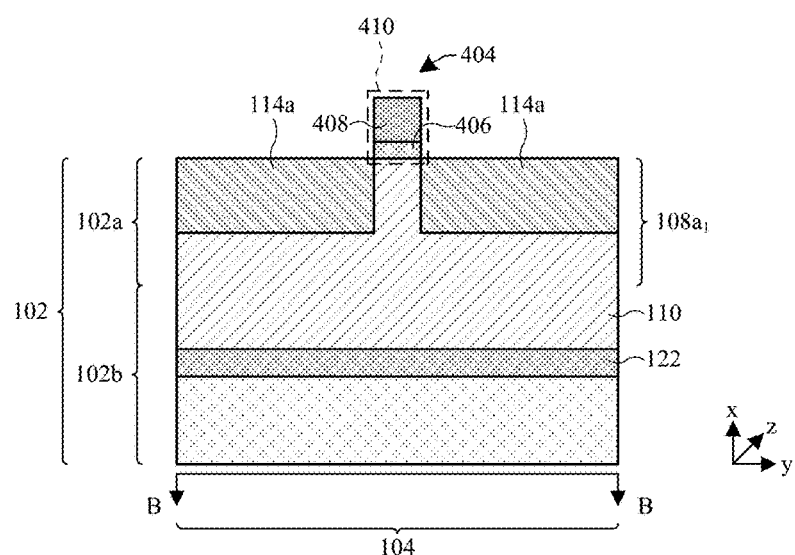

FIGS. 4A-4C illustrate various views of some other embodiments of the IC 100 of FIG. 1. FIG. 4A illustrates an isometric view of some other embodiments of the IC of FIG. 1. FIG. 4B illustrates a cross-sectional view of some embodiments of the IC of FIG. 4A taken along line A-A of FIG. 4A. FIG. 4C illustrates a cross-sectional view of some embodiments of the IC of FIG. 4A taken along line B-B of FIG. 4A.

As shown in FIGS. 4A-4C, an isolation structure 402 is disposed over the lower region 102b of the semiconductor substrate 102. The upper region 102a of the semiconductor substrate 102 extends vertically through the isolation structure 402, such that the fins 108 are at least partially disposed over the isolation structure 402. The isolation structure 402 electrically isolates the fins 108 from one another. In some embodiments, the isolation structure 402 may comprise, for example, an oxide (e.g., silicon dioxide ($SiO_2$)), a nitride (e.g., silicon nitride (SiN)), an oxy-nitride (e.g., silicon oxy-nitride ($SiO_XN_Y$)), some other dielectric material, or a combination of the foregoing. The isolation structure 402 may be a multi-layer structure, for example, comprising one or more liner layers.

A continuous gate structure 404 is disposed over the isolation structure 402 and over the fins 108. The continuous gate structure 404 extends continuously across the isolation structure 402 and over the fins 108 (along the "z" direction). The continuous gate structure 404 extends (along the "z" direction) between each pair of the first source/drain regions 114 and each pair of the second source/drain regions 118.

The continuous gate structure 404 comprises a continuous gate dielectric structure 406 and a continuous gate electrode structure 408. The continuous gate dielectric structure 406 extends continuously across the isolation structure 402 (along the "z" direction) and engages each of the fins 108 on three sides. For example, the continuous gate electrode structure 408 extends continuously across the isolation structure 402 (along the "z" direction) and engages three sides of the second fin $108a_2$ and three sides of the fifth fin $108b_2$. The continuous gate structure 404 extends continuously (along the "z" direction) between each pair of the first source/drain regions 114 and each pair of the second source/drain regions 118.

The continuous gate electrode structure 408 is disposed over the continuous gate dielectric structure 406. The continuous gate electrode structure 408 extends continuously (along the "z" direction) on the continuous gate dielectric structure 406 and over the fins 108. In some embodiments, the continuous gate electrode structure 408 has a substantially planar upper surface.

In some embodiments, the continuous gate dielectric structure 406 comprises an oxide (e.g., $SiO_2$), a high-k dielectric (e.g., a dielectric material with a dielectric constant greater than 3.9), some other dielectric material, or a combination of the foregoing. The continuous gate dielectric structure 406 may be a multi-layered structure, for example, comprising one or more interfacial layers. In further embodiments, the continuous gate electrode structure 408 may comprise, for example, polysilicon, a metal (e.g., tungsten (W)), some other conductive material, or a combination of the foregoing. The continuous gate electrode structure 408 may be a multi-layered structure. For example, in some embodiments, the continuous gate electrode structure 408 may comprise, for example, a work function metal layer and a metal fill layer. In yet further embodiments, the continuous gate structure 404 may comprise an interfacial layer, a high-k dielectric layer disposed over the interfacial layer, a barrier layer disposed over the high-k dielectric layer, a work function metal layer disposed over the barrier layer, and a metal fill layer disposed over the work function metal layer.

The continuous gate structure 404 comprises a plurality of gate structures 410. For clarity in FIGS. 4A-4C, only one of the gate structures 410 is labeled. In some embodiments, the gate structures 410 are portions of the continuous gate structure 404 disposed between a pair of source/drain regions, respectively. For example, a first gate structure, which is a first portion of the continuous gate structure 404, is disposed between the first pair 114a of the first source/drain regions 114, and a second gate structure, which is a second portion of the continuous gate structure 404, is disposed between the third pair 118a of the second source/drain regions 118. Each of the gate structures 410 may engage three sides of one of the fins 108. For example, the first gate structure engages three sides of the first fin $108a_1$, and the second gate structure engages three sides of the fourth fin $108b_1$.

Each of the gate structures 410 comprise a portion of the continuous gate dielectric structure 406, which may be referred to as a gate dielectric structure, and a portion of the continuous gate electrode structure 408, which may be referred to as a gate electrode structure. For example, the first gate structure comprises a first portion of the continuous gate dielectric structure 406, which may be referred to as a first gate dielectric structure, and a first portion of the continuous gate electrode structure 408, which may be referred to as a first gate electrode structure. The first portion of the continuous gate dielectric structure 406 contacts the isolation structure 402 and engages the first fin $108a_1$ on three sides, and the first portion of the continuous gate electrode structure 408 directly overlies the first portion of the continuous gate dielectric structure 406. Each of the gate structures 410 may be electrically coupled together by other portions of the continuous gate structure 404 disposed between two neighboring gate structures 410. For example, a third portion of the continuous gate structure 404, which extends from the first gate structure to the second gate structure, may electrically couple the first gate structure to the second gate structure. It will be appreciated that, rather than the gate structures 410 being portions of the continuous gate structure 404, the gate structures 410 may be discrete gate structures that are separated from one another by a dielectric structure (e.g., by an interlayer dielectric structure).

The gate structures 410 control a conductivity of the selectively-conductive channels (e.g., switch between one or more conducting states and a non-conducting state) disposed between each pair of source/drain regions. For example, the first gate structure is configured to control the conductivity of the first selectively-conductive channel disposed between the first pair 114a of the first source/drain regions 114, and the second gate structure is configured to control the conductivity of the second selectively-conductive channel disposed between the third pair 118a of the second source/drain regions 118.

The first gate structure, the first selectively-conductive channel, and the first pair 114a of the first source/drain regions 114 form a first FinFET, and the second gate structure, the second selectively-conductive channel, and the third pair 118a of the second source/drain regions 118 form a second FinFET. More specifically, due to the doping types of the first pair 114a of the first source/drain regions 114 and the first doped region 110, the first pair 114a of the first source/drain regions 114, the first gate structure, and the first selectively-conductive channel form a n-channel FinFET; and due to the doping types of the third pair 118a of the second source/drain regions 118 and the second doped region 112, the third pair 118a of the second source/drain regions 118, the second gate structure, and the second selectively-conductive channel form a p-channel FinFET. In some embodiments, because the third portion of the continuous gate structure 404 may electrically couple the first gate structure to the second gate structure, the n-channel FinFET and the p-channel FinFET may form a complementary metal-oxide-semiconductor (CMOS) device (e.g., a CMOS inverter). It will be appreciated that an interconnect structure (e.g., copper interconnect) may electrically couple the first gate structure and the second gate structure together, such that the n-channel FinFET and the p-channel FinFET form the CMOS device. In further embodiments, the only type of FinFETs disposed in the first region 104 of the IC 100 are n-channel FinFETs. In yet further embodiments, the only type of FinFETs disposed in the second region 106 of the IC 100 are p-channel FinFETs.

In some embodiments, the n-channel FinFETs and the p-channel FinFETs are parts of a memory device disposed on the IC 100 (e.g., static random-access memory (SRAM) device, dynamic random-access memory device, flash memory device, etc.). In further embodiments, the one or more first pick-up regions 116 (see, e.g., FIG. 1), the one or more second pick-up regions 120 (see, e.g., FIG. 1), and/or the one or more third pick-up regions (not shown) may be disposed in a designated pick-up zone of the IC 100. For example, the IC 100 may comprise a designated edge pick-up zone (or middle pick-up zone) disposed near an edge of the IC 100 (or an edge of the memory device) in which the one or more first pick-up regions 116, the one or more second pick-up regions 120, and/or the one or more third pick-up regions are disposed.

In some embodiments, each of the first source/drain regions 114 and/or each of the second source/drain regions 118 are disposed at least partially below an upper surface of the isolation structure 402 and at least partially over the upper surface of the isolation structure 402. For example, a fifth pair 114c of the first source/drain regions 114 are disposed on/in a seventh fin $108a_4$, and each of the source/drain regions of the fifth pair 114c of the first source/drain regions 114 are disposed at least partially below the upper surface of the isolation structure 402 and partially above the upper surface of the isolation structure 402.

The first set of fins 108a has a first fin density per a unit of area (e.g., 1 um×1 um area). The first fin density is a number of fins 108 of the first set of fins 108a disposed in the unit of area. The second set of fins 108b has a second fin density per the unit of area. The second fin density is a number of fins 108 of the second set of fins 108b disposed in the unit of area. In some embodiments, the first fin density is greater than the second fin density. In further embodiments, if the first fin density is greater than the second fin density, the memory device disposed on the IC 100 may be a high-current memory device (e.g., a high-current SRAM memory device). By utilizing the first epitaxial structure 122 in the high-current memory device, the latch-up immunity of the IC 100 may be improved (e.g., due to the high-current memory device being more sensitivity to a latch-up event than other types of memory devices, such as a high-density SRAM memory device). In yet further embodiments, the first fin density is at least twice the second fin density.

Figure 5A:
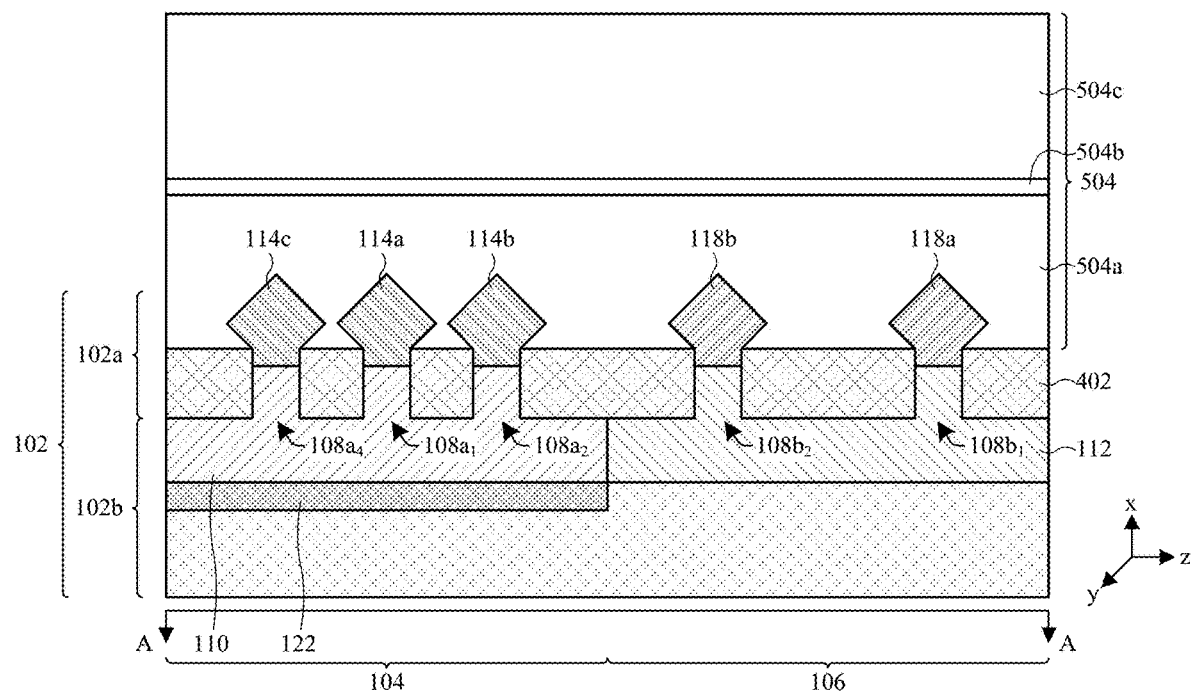
FIGS. 5A-5B illustrate various cross-sectional views of some other embodiments of the IC of FIGS. 4A-4C.
Figure 5B:
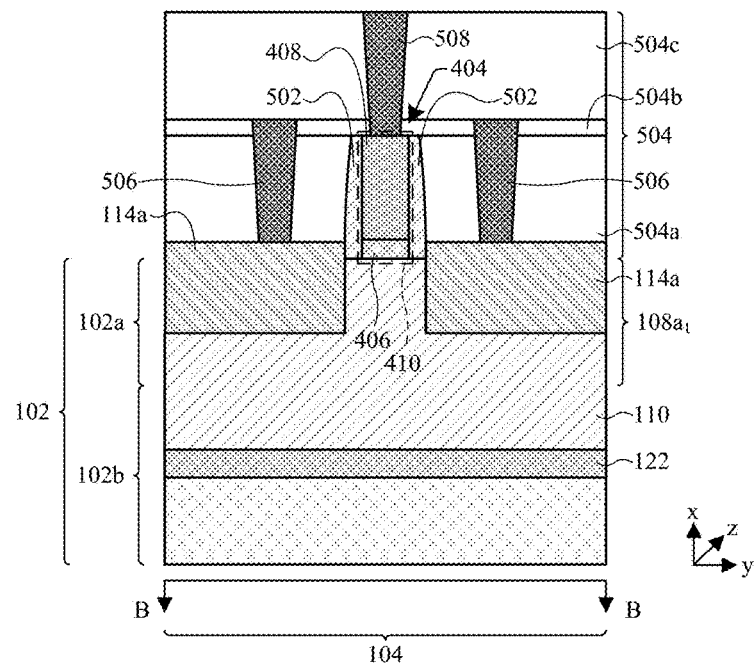

FIGS. 5A-5B illustrate various cross-sectional views of some other embodiments of the IC 100 of FIGS. 4A-4C. FIG. 5A illustrates a cross-sectional view of some other embodiments of the IC of FIG. 4A taken along line A-A of FIG. 4A. FIG. 5B illustrates a cross-sectional view of some embodiments of the IC of FIG. 4A taken along line B-B of FIG. 4A.

As shown in FIGS. 5A-5B, the first source/drain regions 114 and/or the second source/drain regions 118 may have a diamond-shaped profile. In such embodiments, the first source/drain regions 114 and the second source/drain regions 118 may be epitaxial structures (e.g., epitaxial SiGe, epitaxial SiC, or the like). In further embodiments, the surfaces of the sidewalls of the diamond-shaped profile may be along a (111) crystal plane.

In some embodiments, a sidewall spacer 502 is disposed on opposite sides of each of the gate structures 410. In further embodiments, the sidewall spacer 502 is a continuous structure that is disposed on opposite sides of the continuous gate structure 404. The sidewall spacer 502 may comprise, for example, an oxide (e.g., $SiO_2$), a nitride (e.g., SiN), an oxy-nitride ($SiO_XN_Y$), some other dielectric material, or a combination of the foregoing. The sidewall spacer 502 may be a multi-layer structure, for example, comprising one or more sidewall spacer layers. In yet further embodiments, the first source/drain regions 114 and/or the second source/drain regions 118 may extend vertically above an uppermost surface of the upper region 102a of the semiconductor substrate 102. In such embodiments, the first source/drain regions 114 and/or the second source/drain regions 118 may contact the sidewall spacer 502.

An interlayer dielectric (ILD) structure 504 is disposed over the various structures discussed above (e.g., the semiconductor substrate 102, the first doped region 110, the second doped region 112, the first epitaxial structure 122, the fins 108, the gate structures 410, the isolation structure 402, the first source/drain regions 114, the second source/drain regions 118, the one or more first pick-up regions 116, and the one or more second pick-up regions 120). The ILD structure 504 comprises one or more stacked ILD layers, which may respectively comprise a low-k dielectric (e.g., a dielectric material with a dielectric constant less than about 3.9), an oxide (e.g., $SiO_2$), or the like. In some embodiments, the ILD structure 504 comprises a first ILD structure 504a, a second ILD structure 504b, and a third ILD structure 504c. In further embodiments, the first ILD structure 504a may have an upper surface that is substantially co-planar with an upper surface of the continuous gate electrode structure 408 and/or an upper surface of the sidewall spacer 502. The second ILD structure 504b is disposed over the first ILD structure 504a, the gate structures 410, and the sidewall spacer 502. The third ILD structure 504c is disposed over the second ILD structure 504b. The first ILD structure 504a, the second ILD structure 504b, and the third ILD structure 504c may each comprises one or more stacked ILD layers, which may respectively comprise a low-k dielectric (e.g., a dielectric material with a dielectric constant less than about 3.9), an oxide (e.g., $SiO_2$), or the like.

A plurality of first conductive contacts 506 are disposed over the semiconductor substrate 102 and in the first ILD structure 504a and in the second ILD structure 504b. The first conductive contacts 506 extend above the semiconductor substrate 102 vertically through both the first ILD structure 504a and the second ILD structure 504b. In some embodiments, each of the first conductive contacts 506 is electrically coupled to one of the first source/drain regions 114, one of the second source/drain regions 118, one of the one or more first pick-up regions 116, or one of the one or more second pick-up regions 120. In further embodiments, upper surfaces of the first conductive contacts 506 may be substantially co-planar with an upper surface of the second ILD structure 504b. In yet further embodiments, the first conductive contacts 506 may comprise, for example, tungsten (W), aluminum (Al), copper (Cu), or the like.

One or more second conductive contacts 508 are disposed over the continuous gate structure 404 and in the third ILD structure 504c and in the second ILD structure 504b. The one or more second conductive contacts 508 are electrically coupled to the continuous gate electrode structure 408. In some embodiments, upper surfaces of the one or more second conductive contacts 508 may be substantially co-planar with an upper surface of the third ILD structure 504c. In further embodiments, the one or more second conductive contacts 508 may comprise, for example, W, Al, Cu, or the like. In yet further embodiments, each of the one or more second conductive contacts 508 contacts a gate electrode of one of the gate structures 410. It will be appreciated that any number of additional ILD structures may be disposed over the third ILD structure 504c and any number of other conductive features (e.g., metal lines, metal vias, etc.) may be disposed in the additional ILD structures. It will further be appreciated that the other conductive features may be electrically coupled to the first conductive contacts 506 and/or the one or more second conductive contacts 508 to form an interconnect structure (e.g., copper interconnect) disposed over the semiconductor substrate 102 that interconnects various semiconductor devices of the IC 100.

Figure 6A:
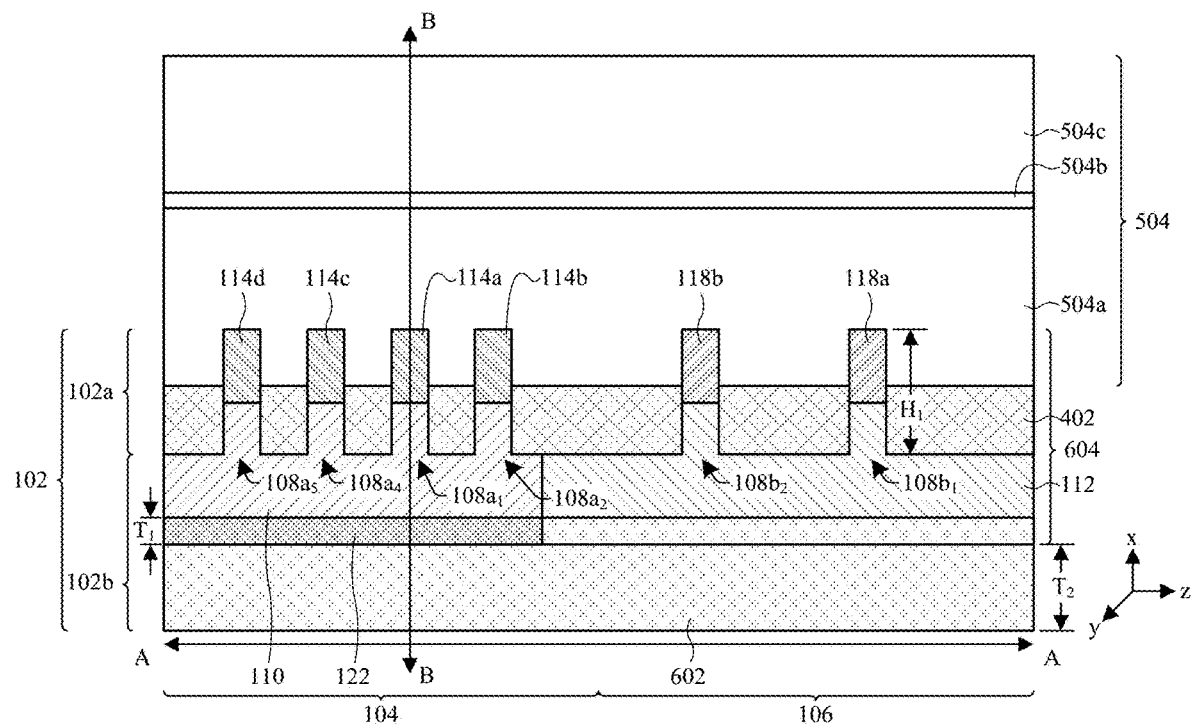
FIGS. 6A-6B illustrate various cross-sectional views of some other embodiments of the IC of FIGS. 4A-4C.
Figure 6B:
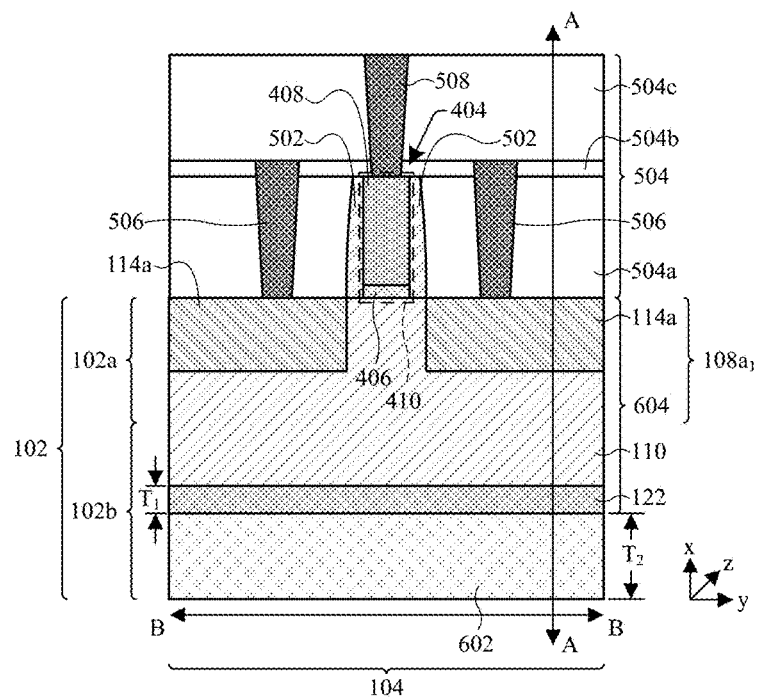

FIGS. 6A-6B illustrate various cross-sectional views of some other embodiments of the IC 100 of FIGS. 4A-4C. FIG. 6A illustrates a cross-sectional view of some other embodiments of the IC of FIG. 6B taken along line A-A of FIG. 6B. FIG. 6B illustrates a cross-sectional view of some embodiments of the IC of FIG. 6A taken along line B-B of FIG. 6A.

As shown in FIGS. 6A-6B, the lower region 102b of the semiconductor substrate 102 comprises a base substrate 602 and a second epitaxial structure 604. The base substrate 602 may comprise any type of semiconductor body (e.g., monocrystalline silicon/CMOS bulk, silicon-germanium (SiGe), silicon carbide, etc.). In some embodiments, the base substrate 602 has the first doping type. In further embodiments, the base substrate 602 has the third doping concentration of the first doping type dopants.

The base substrate 602 has a second thickness $T_2$. The second thickness $T_2$ may be less than or equal to 800 um. In some embodiments, the second thickness $T_2$ is between 600 um and 800 um. A ratio of the first thickness $T_1$ to the second thickness $T_2$ may be between 1:200 and 1:800. In further embodiments, if the ratio of the first thickness $T_1$ to the second thickness $T_2$ is between 1:200 and 1:800, then dislocation defects at an interface between the first epitaxial structure 122 and the base substrate 602 are reduced, thereby improving the latch-up immunity of the IC 100 (e.g., due to a reduction in dislocation defects decreasing the resistance of the first epitaxial structure 122). In other words, if the ratio of the first thickness $T_1$ to the second thickness $T_2$ is smaller than 1:200, the dislocation defects at the interface between the first epitaxial structure 122 and the base substrate 602 are not sufficiently reduced; if the ratio is greater than 1:800, the manufacturing costs increase without significant improvement.

The second epitaxial structure 604 is a semiconductor material (e.g., silicon, germanium, SiGe, or the like). In some embodiments, the second epitaxial structure 604 extends from an upper surface of the base substrate 602 and the upper surface of the first epitaxial structure 122 to an uppermost surface of the semiconductor substrate 102. The second epitaxial structure 604 and the base substrate 602 may be the same semiconductor material (e.g. silicon). In further embodiments, the second epitaxial structure 604, the base substrate 602, and the first epitaxial structure 122 may be the same semiconductor material (e.g. silicon). In further embodiments, the second epitaxial structure 604 may have a same crystalline structure as the base substrate 602 and/or the first epitaxial structure 122. For example, the second epitaxial structure 604 may be monocrystalline silicon, and the base substrate 602 may be monocrystalline silicon and/or the first epitaxial structure 122 may be monocrystalline silicon. In yet further embodiments, the base substrate 602 may be referred to as a first portion of the semiconductor substrate 102, and the second epitaxial structure 604 may be referred to as a second portion of the semiconductor substrate 102.

Also shown in FIGS. 6A-6B, the first set of fins 108a comprises an eighth fin 108$a_5$. A sixth pair 114d of the first source/drain regions 114 are disposed on/in the eighth fin 108$a_5$.

Figure 7A:
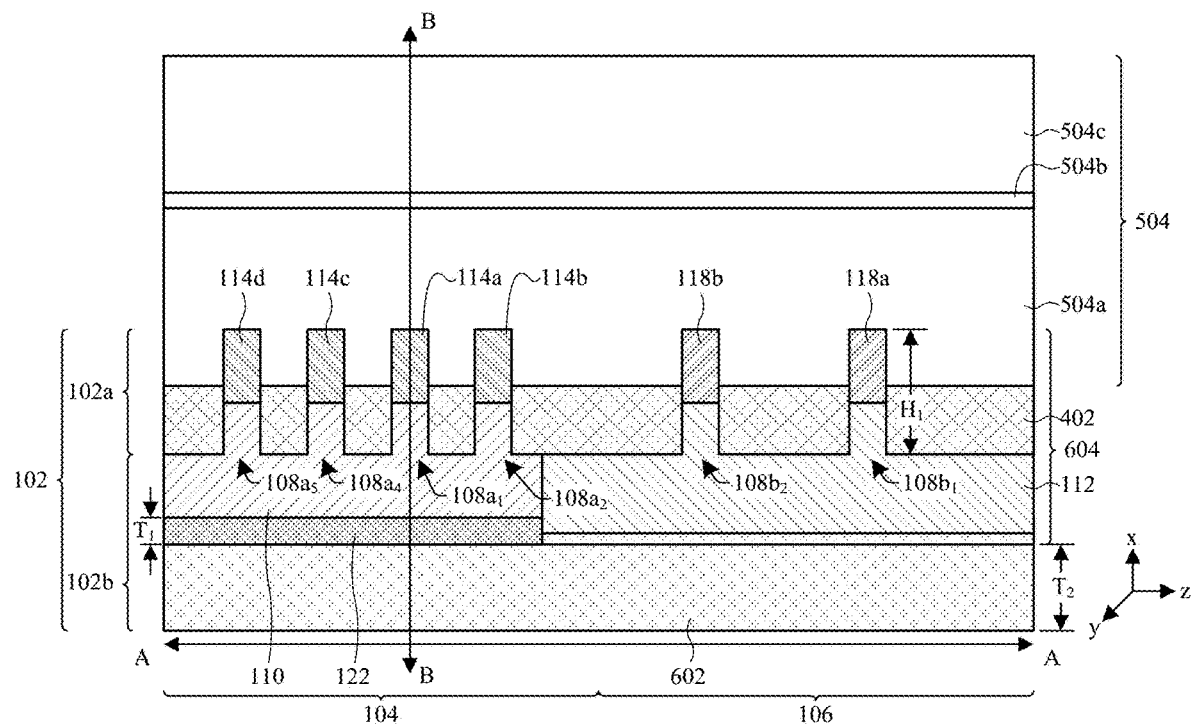
FIGS. 7A-7B illustrate various cross-sectional views of some other embodiments of the IC of FIGS. 4A-4C.
Figure 7B:
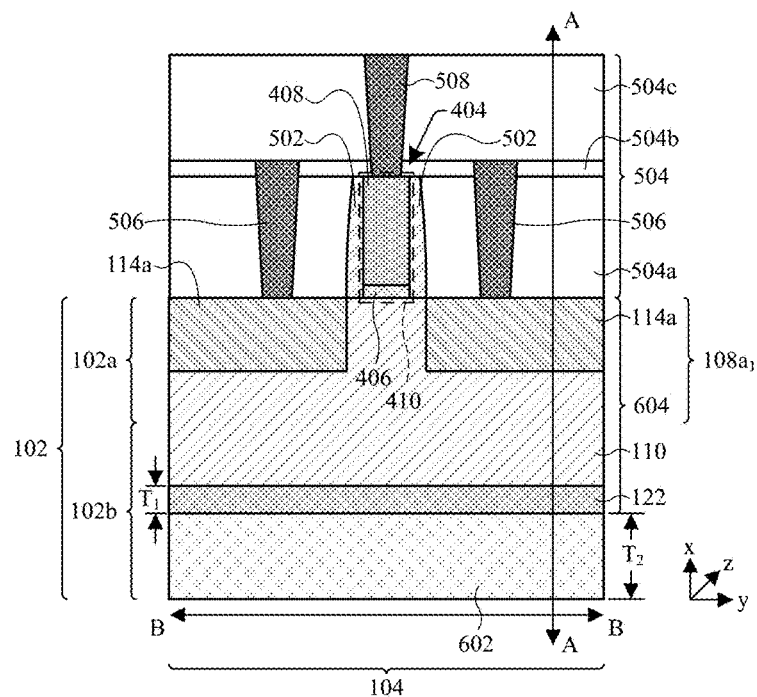

FIGS. 7A-7B illustrate various cross-sectional views of some other embodiments of the IC 100 of FIGS. 4A-4C. FIG. 7A illustrates a cross-sectional view of some other embodiments of the IC of FIG. 7B taken along line A-A of FIG. 7B. FIG. 7B illustrates a cross-sectional view of some embodiments of the IC of FIG. 7A taken along line B-B of FIG. 7A.

As shown in FIGS. 7A-7B, the lower side of the second doped region 112 is disposed below the upper surface of the first epitaxial structure 122. In some embodiments, the lower side of the second doped region 112 is disposed below a lower surface of the first epitaxial structure 122. In further embodiments, the second doped region 112 is partially disposed in the base substrate 602.

Figure 8:
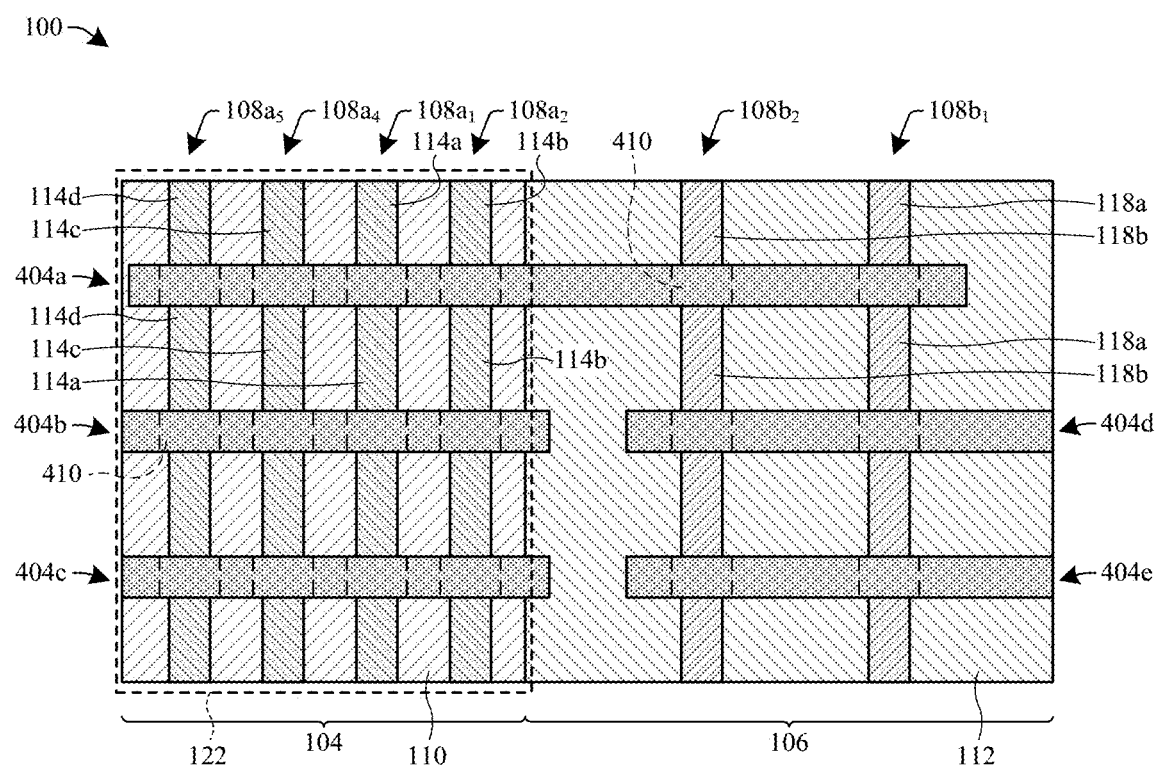
FIG. 8 illustrates a layout view of some other embodiments of the IC of FIGS. 4A-4C.

FIG. 8 illustrates a layout view of some other embodiments of the IC 100 of FIGS. 4A-4C.

As shown in FIG. 8, the IC 100 comprises a plurality of continuous gate structures 404a-e. For example, the IC comprises a first continuous gate structure 404a, a second continuous gate structure 404b, a third continuous gate structure 404c, a fourth continuous gate structure 404d, and a fifth continuous gate structure 404e. In some embodiments, some of the continuous gate structures 404a-e may continuously extend over one or more of the fins 108 of the first set of fins 108a and one or more of the fins 108 of the second set of fins 108b. For example, the first continuous gate structure 404a continuously extends over the eighth fin 108$a_5$, the seventh fin 108$a_4$, the first fin 108$a_1$, the second fin 108$a_2$, the fifth fin 108$b_2$, and the fourth fin 108$b_1$. In further embodiments, some other of the continuous gate structures 404a-e may not continuously extend over both some of the fins 108 of the first set of fins 108a and over some of the fins 108 of the second set of fins 108b. For example, the second continuous gate structure 404b extends continuously over the eighth fin 108$a_5$, the seventh fin 108$a_4$, the first fin 108$a_1$, and the second fin 108$a_2$, and has a sidewall disposed between the second fin 108$a_2$ and the fifth fin 108$b_2$. In yet further embodiments, the sidewall of the second continuous gate structure 404b that is disposed between the second fin 108$a_2$ and the fifth fin 108$b_2$ may be disposed between the sidewall of the first epitaxial structure 122 (which is shown in phantom in FIG. 8) and a sidewall of the fourth continuous gate structure 404d.

While FIG. 8 illustrates the IC 100 comprising five continuous gate structures, it will be appreciated that the IC 100 may comprise any number of continuous gate structures. Further, while FIG. 8 illustrates the IC 100 comprising six fins, it will be appreciated that the IC 100 may comprise any number of fins. Moreover, while FIG. 8 illustrates the first source/drain regions 114 and the second source/drain regions 118 continuously extending between two neighboring continuous gate structures 404a-e, it will be appreciated that some (or all) of the first source/drain regions 114 and/or some (or all) of the second source/drain regions 118 may not continuously extend between two neighboring continuous gate structures 404a-e. For example, FIG. 8 illustrates one of the first source/drain regions 114 of one of the first pair 114a of the first source/drain regions 114 continuously extending from the first continuous gate structure 404a to the second continuous gate structure 404b. However, it will be appreciated that the one of the first source/drain regions 114 may not continuously extend from the first continuous gate structure 404a to the second continuous gate structure 404b. In such embodiments, the one of the first source/drain regions 114 may be spaced from the second continuous gate structure 404b, and a different pair of first source/drain regions 114 may be disposed on opposite sides of the second continuous gate structure 404b. In further such embodiments, an isolation structure (not shown) may separate the one of the first source/drain regions 114 from the different pair of first source/drain regions 114.

Figure 9:
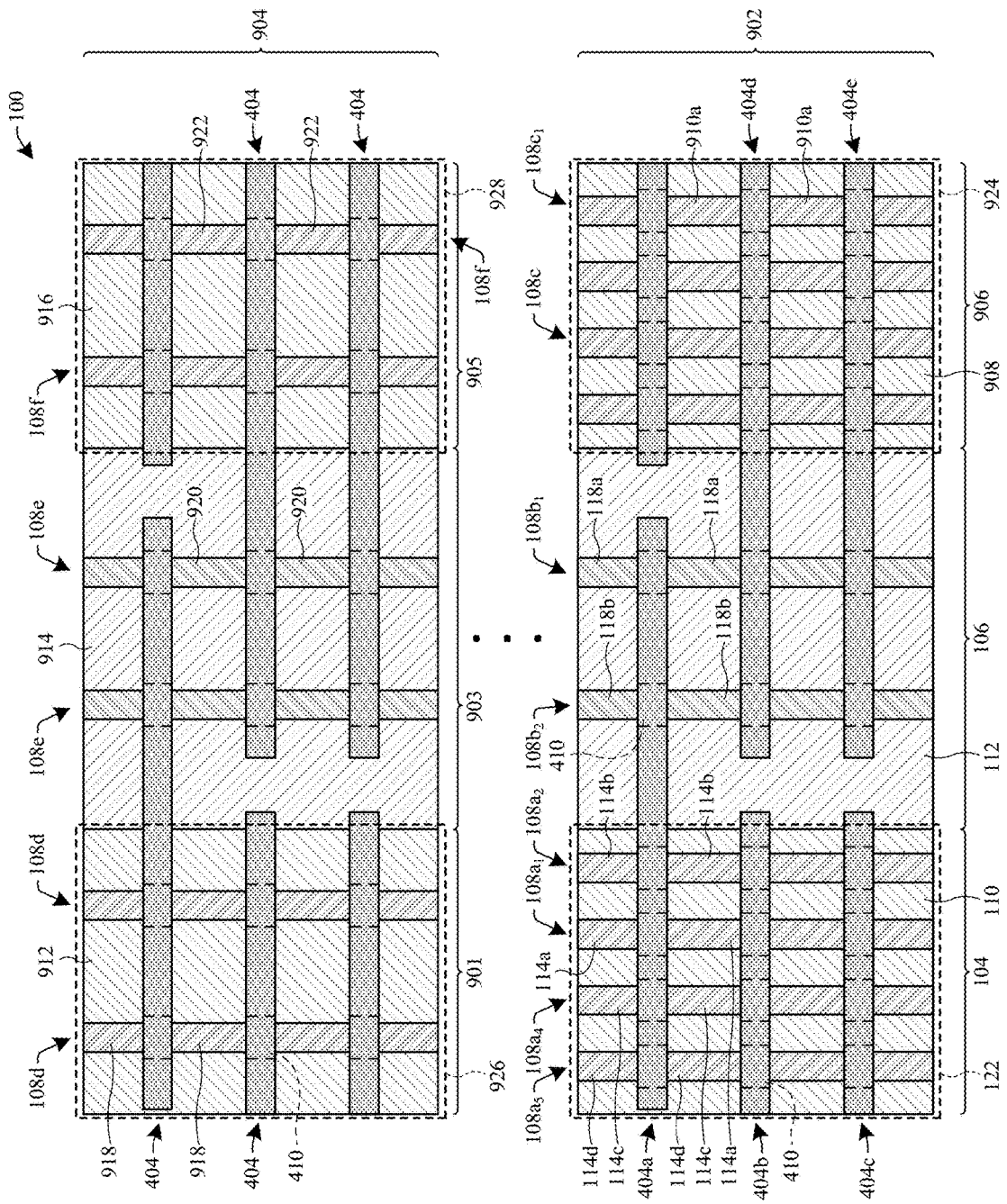
FIG. 9 illustrates a layout view of some other embodiments of the IC of FIGS. 4A-4C.

FIG. 9 illustrates a layout view of some other embodiments of the IC 100 of FIGS. 4A-4C.

As shown in FIG. 9, the IC 100 comprises a high-current memory cell 902 (e.g., a high-current SRAM cell) and a high-density memory cell 904 (e.g., a high-density SRAM cell). The high-density memory cell 904 is disposed on a first side of the high-current memory cell 902. The first side of the high-current memory cell 902 is laterally spaced in a first direction from a second side of the high-current memory cell 902 opposite the first side of the high-current memory cell 902. In other embodiments, the high-density memory cell 904 is disposed on a third side of the high-current memory cell 902. The third side of the high-current memory cell 902 is laterally spaced in a second direction perpendicular to the first direction from a fourth side of the high-current memory cell 902 opposite the third side of the high-current memory cell 902.

The IC 100 comprises a third region 906, a fourth region 901, a fifth region 903, and a sixth region 905. In such embodiments, the first region 104 of the IC 100 is referred to as a first NMOS region, the second region 106 of the IC 100 is referred to as a first PMOS region, the third region 906 is referred to as a second NMOS region, the fourth region 901 is referred to as a third NMOS region, the fifth region 903 is referred to as a second PMOS region, and the sixth region 905 is referred to as a fourth NMOS region. The first region 104, the second region 106, and the third region 906 are disposed in the high-current memory cell 902. The second region 106 is disposed between the first region 104 and the third region 906. The fourth region 901, the fifth region 903, and the sixth region 905 are disposed in the high-density memory cell 904. The fifth region 903 is disposed between the fourth region 901 and the sixth region 905.

A third set of fins 108c are disposed in the third region 906 of the IC 100. In some embodiments, the fins 108 of the third set of fins 108c comprise substantially similar features (e.g., structural features, doping type, doping concentration, etc.) as the fins 108 of the first set of fins 108a. A pair of third source/drain regions 910 are disposed on/in some of the fins 108 of the third set of fins 108c. For example, a seventh pair 910a of the third source/drain regions 910 are disposed on/in a ninth fin $108c_1$. In further embodiments, the third source/drain regions 910 comprise substantially similar features (e.g., structural features, doping type, doping concentration, etc.) as the first source/drain regions 114.

A third doped region 908 is disposed in the semiconductor substrate 102 and in the third region 906. In some embodiments, the third region 906 of the IC 100 is defined by a perimeter of the third doped region 908. In further embodiments, the third doped region 908 comprises substantially similar features (e.g., structural features, doping type, doping concentration, etc.) as the first doped region 110. For example, the third doped region 908 comprises the first doping type, and the third doped region 908 is disposed at least partially in the third set of fins 108c.

A portion of the ninth fin $108c_1$ is disposed between the seventh pair 910a of the third source/drain regions 910. In some embodiments, the third doped region 908 is disposed in the portion of the ninth fin $108c_1$ that is disposed between the seventh pair 910a of the third source/drain regions 910. A third selectively-conductive channel is disposed in the portion of the ninth fin $108c_1$ that is disposed between the seventh pair 910a of the third source/drain regions 910. The third selectively-conductive channel extends between the seventh pair 910a of the third source/drain regions 910. In further embodiments, the seventh pair 910a of the third source/drain regions 910 and the third selectively-conductive channel are part of an n-channel FinFET.

The third set of fins 108c has a third fin density. The third fin density is a number of fins 108 of the third set of fins 108c disposed in the unit of area. The third fin density is greater than the second fin density. In some embodiments, the third fin density is at least twice the second fin density. In further embodiments, the third fin density is the same as the first fin density.

The high-density memory cell 904 comprises substantially similar features (e.g., structural features, doping type, doping concentration, etc.) as the high-current density cell 902 but has a different fin density ratio than a fin density ratio of the high-current memory cell 902. For example, the high-density memory cell 904 comprises: (1) a fourth doped region 912 disposed in the fourth region 901 and comprising substantially similar features as the first doped region 110; (2) a fifth doped region 914 disposed in the fifth region 903 and comprising substantially similar features as the second doped region 112; (3) a sixth doped region 916 disposed in the sixth region 905 and comprising substantially similar features as the third doped region 908; (4) a fourth set of fins 108d disposed in the fourth region 901, in which the fins 108 of the fourth set of fins 108d comprise substantially similar features as the fins 108 of the first set of fins 108a; (5) a fifth set of fins 108e disposed in the fifth region 903, in which the fins 108 of the fifth set of fins 108e comprise substantially similar features as the fins 108 of the second set of fins 108b; (6) a sixth set of fins 108f disposed in the sixth region 905, in which the fins 108 of the sixth set of fins 108f comprise substantially similar features as the fins 108 of the third set of fins 108c; (7) fourth source/drain regions 918 disposed on/in the fins 108 of the fourth set of fins 108d and comprising substantially similar features as the first source/drain regions 114; (8) fifth source/drain regions 920 disposed on/in the fins 108 of the fifth set of fins 108e and comprising substantially similar features as the second source/drain regions 118; and (9) sixth source/drain regions 922 disposed on/in the fins 108 of the sixth set of fins 108f and comprising substantially similar features as the third source/drain regions 910.

The fourth set of fins 108d has a fourth fin density. The fourth fin density is a number of fins 108 of the fourth set of fins 108d disposed in the unit of area. The fifth set of fins 108e has a fifth fin density. The fifth fin density is a number of fins 108 of the fifth set of fins 108e disposed in the unit of area. The sixth set of fins 108f has a sixth fin density. The sixth fin density is a number of fins 108 of the sixth set of fins 108f disposed in the unit of area. The fourth fin density, the fifth fin density, and the sixth fin density are less than both the first fin density and the third fin density. In some embodiments, the fourth fin density, the fifth fin density, and the sixth fin density are the same. In further embodiments, the fourth fin density, the fifth fin density, the sixth fin density are the same as the second fin density.

The fin density ratio of the high-density memory cell 904 refers to a ratio of the fourth fin density to the fifth fin density to the sixth fin density (e.g., "fourth fin density":"fifth fin density":"sixth fin density"). In some embodiments, the fin density ratio of the high-density memory cell 904 is 1:1:1. The fin density ratio of the high-current memory cell 902 refers to a ratio of the second fin density to the first fin density to the third fin density (e.g., "second fin density": "first fin density":"third fin density"). In some embodiments, the fin density ratio of the high-current memory cell 902 is 1:2:2.

Because the high-density memory cell 904 comprises substantially similar features as the high-current density cell 902 (but with a different fin density ratio), it will be appreciated that n-channel FinFETs are disposed in the first region 104, the third region 906, the fourth region 901, and the sixth region 905, and p-channel FinFETs are disposed in the second region 106 and the fifth region 903. In some embodiments, the n-channel FinFETs may be pull-up transistors and/or pull-down transistors. In further embodiments, the p-channel FinFETs may be pass-gate transistors (e.g., access transistors). The pull-up transistor, the pull-down transistors, and/or the pass-gate transistors may be multi-fin transistors (e.g., a 2-fin pull-up transistor) and/or single fin transistors (e.g., a 1-fin pull-up transistor).

A third epitaxial structure 924 is disposed in the semiconductor substrate 102 and in the third region 906 of the IC 100. The third epitaxial structure 924 comprises substantially similar features (e.g., structural features, doping type, doping concentration, etc.) as the first epitaxial structure 122. In some embodiments, the third epitaxial structure 902 is laterally spaced from the first epitaxial structure 122.

In some embodiments, a fourth epitaxial structure 926 is disposed in the semiconductor substrate 102 and in the fourth region 901 of the IC 100. The fourth epitaxial structure 926 comprises substantially similar features (e.g., structural features, doping type, doping concentration, etc.) as the first epitaxial structure 122. In some embodiments, the fourth epitaxial structure 926 is laterally spaced from the first epitaxial structure 122 and the third epitaxial structure 924. In other embodiments, the fourth epitaxial structure 926 and the first epitaxial structure 122 are portions of a first continuous epitaxial structure that is laterally spaced from the third epitaxial structure 924. In such embodiments, the first continuous epitaxial structure continuously extends from the first region 104 of the IC 100 into the fourth region 901 of the IC 100.

In some embodiments, a fifth epitaxial structure 928 is disposed in the semiconductor substrate 102 and in the sixth region 905 of the IC 100. The sixth epitaxial structure 928 comprises substantially similar features (e.g., structural features, doping type, doping concentration, etc.) as the first epitaxial structure 122. In some embodiments, the sixth epitaxial structure 928 is laterally spaced from the first epitaxial structure 122, the third epitaxial structure 924, and the fourth epitaxial structure 926. In other embodiments, the fifth epitaxial structure 928 and the third epitaxial structure 924 are portions of a second continuous epitaxial structure that is laterally spaced from the first epitaxial structure 122 and the fourth epitaxial structure 926 (or the first continuous epitaxial structure). In such embodiments, the second continuous epitaxial structure continuously extends from the third region 906 of the IC 100 into the sixth region 905 of the IC 100.

In some embodiments, the first doped region 110 and the fourth doped region 912 are portions of a first continuous doped region that continuously extends from the first region 104 of the IC 100 into the fourth region 901 of the IC 100. In further embodiments, the second doped region 112 and the fifth doped region 914 are portions of a second continuous doped region that continuously extends from the second region 106 of the IC 100 into the fifth region 903 of the IC 100. In yet further embodiments, the third doped region 908 and the sixth doped region 916 are portions of a third continuous doped region that continuously extends from the third region 906 of the IC 100 into the sixth region 905 of the IC 100.

Figure 10:
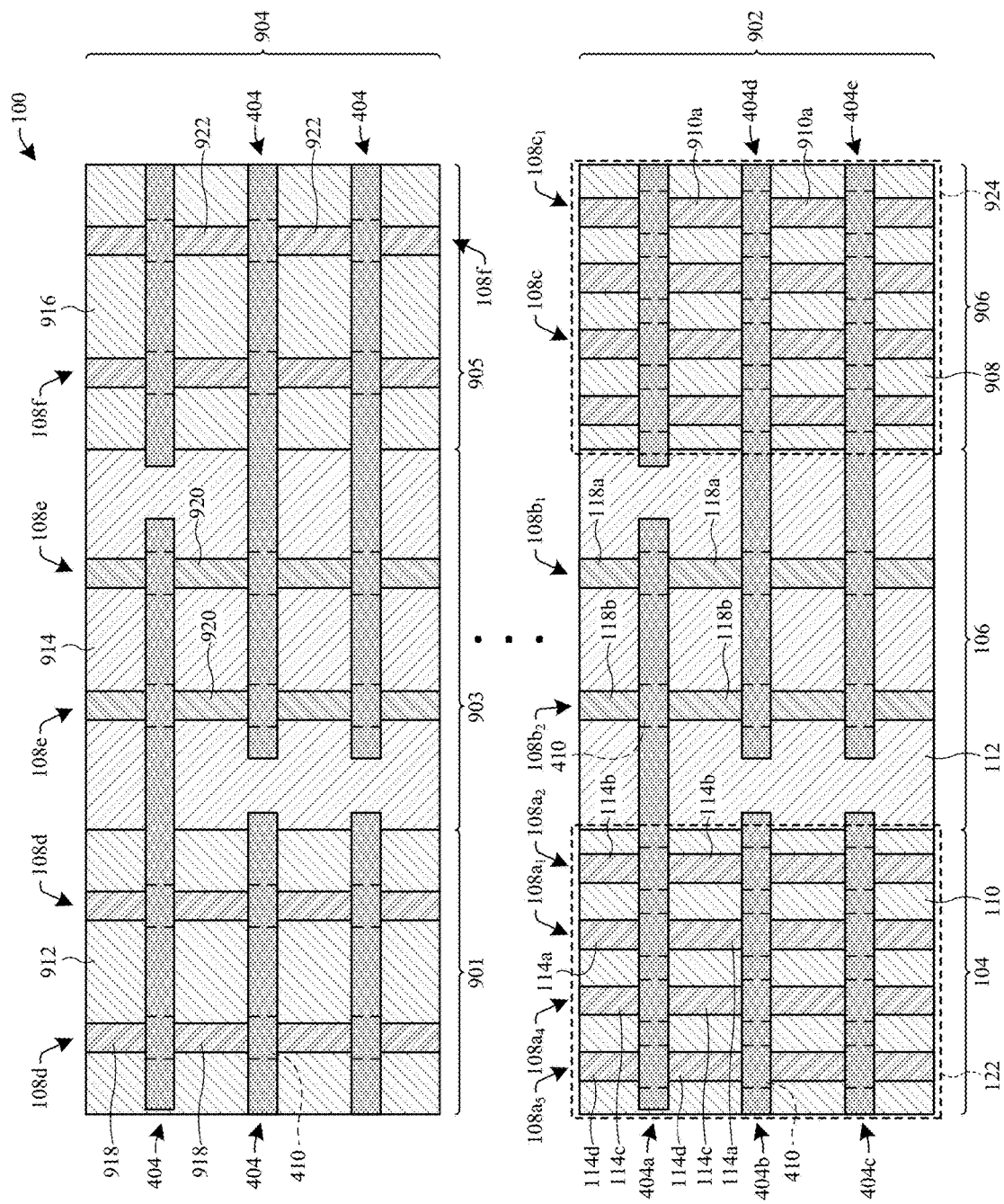
FIG. 10 illustrates a layout view of some other embodiments of the IC of FIGS. 4A-4C.

FIG. 10 illustrate a layout view of some other embodiments of the IC 100 of FIGS. 4A-4C.

As shown in FIG. 10, the fourth epitaxial structure 926 and the fifth epitaxial structure 928 are not disposed in the semiconductor substrate 102 of the IC 100, but the first epitaxial structure 122 and the third epitaxial structure 924 are disposed in the semiconductor substrate 102 of the IC 100. In such embodiments, the high-density memory cell 904 may not comprise any epitaxial structures that comprise substantially similar features as the first epitaxial structure 122 and/or the third epitaxial structure 924. For example, the high-density memory cell 904 does not comprise an epitaxial structure having the first doping type and disposed between the fourth doped region 912 and the base substrate 602, nor does the high-density memory cell 904 comprise an epitaxial structure having the first doping type and disposed between the sixth doped region 916 and the base substrate 602.

FIGS. 11A-11B through FIGS. 22A-22B illustrate a series of various cross-sectional views of some embodiments for forming the IC 100 of FIGS. 6A-6B. Figures with the suffix "A" (e.g., FIG. 11A) illustrate a series of cross-sectional views of some embodiments for forming the structure illustrated in FIG. 6A. Figures with the suffix "B" (e.g., FIG. 11B) illustrate a series of cross-sectional views of some embodiments for forming the structure illustrated in FIG. 6B.

Figure 11A:
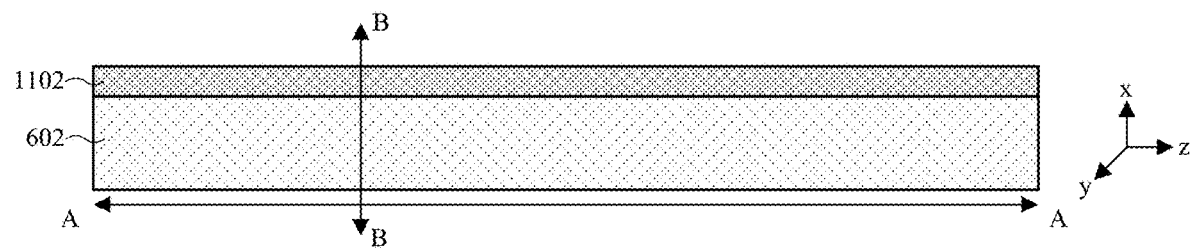
FIGS. 11A-11B through FIGS. 22A-22B illustrate a series of various cross-sectional views of some embodiments for forming the IC of FIGS. 6A-6B.
Figure 11B:
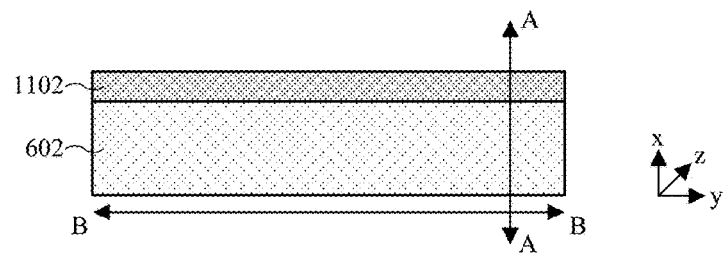

As shown in FIGS. 11A-11B, an epitaxial layer 1102 is formed on a base substrate 602. The base substrate 602 may comprise any type of semiconductor body (e.g., monocrystalline silicon/CMOS bulk, silicon-germanium (SiGe), silicon carbide, etc.). In some embodiments, the base substrate 602 has the first doping type. In further embodiments, the base substrate 602 has the third doping concentration of the first doping type dopants.

The epitaxial layer 1102 is a semiconductor material (e.g., silicon, germanium, SiGe, or the like). In some embodiments, the epitaxial layer 1102 and the base substrate 602 are the same semiconductor material (e.g., silicon). In further embodiments, the epitaxial layer 1102 may have a same crystalline structure as the base substrate 602. For example, the epitaxial layer 1102 may be monocrystalline silicon and the base substrate 602 may be monocrystalline silicon. The epitaxial layer 1102 has the first doping type. The epitaxial layer 1102 has the second doping concentration of the first doping type dopants. In some embodiments, the epitaxial layer 1102 has the first thickness $T_1$.

In some embodiments, a process for forming the epitaxial layer 1102 comprises growing the epitaxial layer 1102 on the base substrate 602 via a first epitaxial process. The first epitaxial process may be, for example, a vapor-phase epitaxial process, a liquid-phase epitaxial process, a molecular-beam epitaxial process, some other epitaxial process, or a combination of the foregoing. In further embodiments, the epitaxial layer 1102 is in-situ doped with first doping type dopants (e.g., doped with the first doping type dopants as the epitaxial layer 1102 is grown via the first epitaxial process), such that the epitaxial layer 1102 is formed with the second doping concentration of the first doping type dopants. For example, during the first epitaxial process, a dopant gas (e.g., diborane) is flowed into a process chamber at a first predefined rate as the epitaxial layer 1102 is being formed, thereby forming the epitaxial layer 1102 with the second doping concentration of the first doping type dopants. In further embodiments, because the epitaxial layer 1102 is formed by the first epitaxial process and is in-situ doped, an upper surface of the epitaxial layer 1102 may be relatively smooth in comparison to a semiconductor material (e.g., the base substrate 602) that is doped by an implantation process (e.g., an ion implantation process). Accordingly, a resistance of the epitaxial layer 1102 may be less than a resistance of a doped region formed in a semiconductor material (e.g., the base substrate 602) by the implantation process (e.g., an ion implantation process).

Figure 12A:
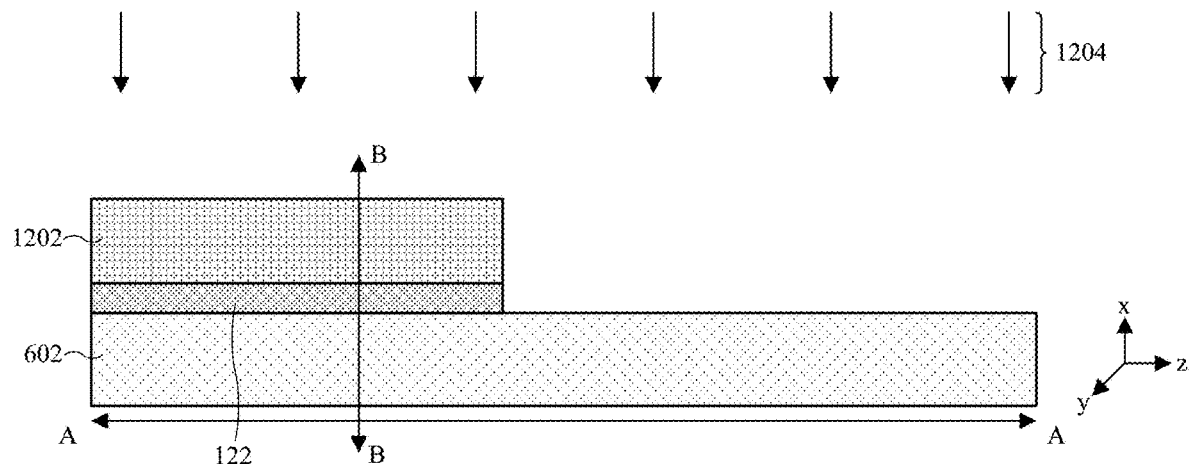
Figure 12B:
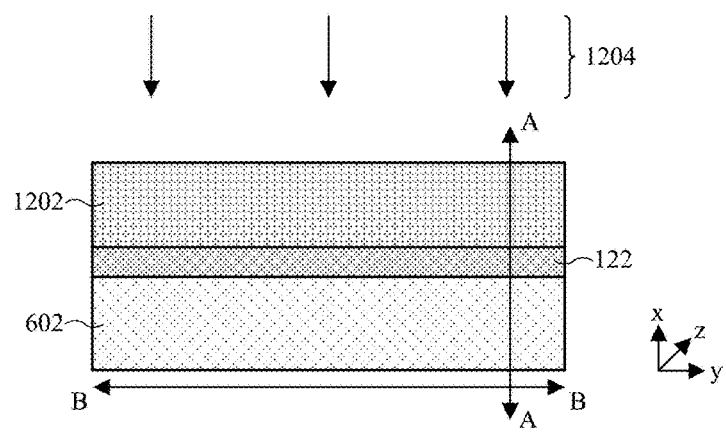

As shown in FIGS. 12A-12B, a first epitaxial structure 122 is formed over the base substrate 602. The first epitaxial structure 122 is a portion of the epitaxial layer 1102 (see, e.g., FIGS. 11A-11B). In some embodiments, a process for forming the first epitaxial structure 122 comprises forming a first patterned masking layer 1202 (e.g., negative/positive photoresist, a hardmask (e.g., an oxide, a nitride, or the like), etc.) on the epitaxial layer 1102. In some embodiments, the first patterned masking layer 1202 may be formed by forming a masking layer overlying the epitaxial layer 1102, exposing the masking layer to a pattern (e.g., via photolithography), and developing the masking layer to form the first patterned masking layer 1202. Thereafter, a first etching process 1204 is performed on the epitaxial layer 1102 to remove portions of the epitaxial layer 1102 not masked by the first patterned masking layer 1202, thereby forming the first epitaxial structure 122. Subsequently, the first patterned masking layer 1202 may be stripped away. In some embodiments, the first etching process 1204 may be a dry etching process, a wet etching process, a reactive ion etching process, some other etching process, or a combination of the foregoing.

Figure 13A:
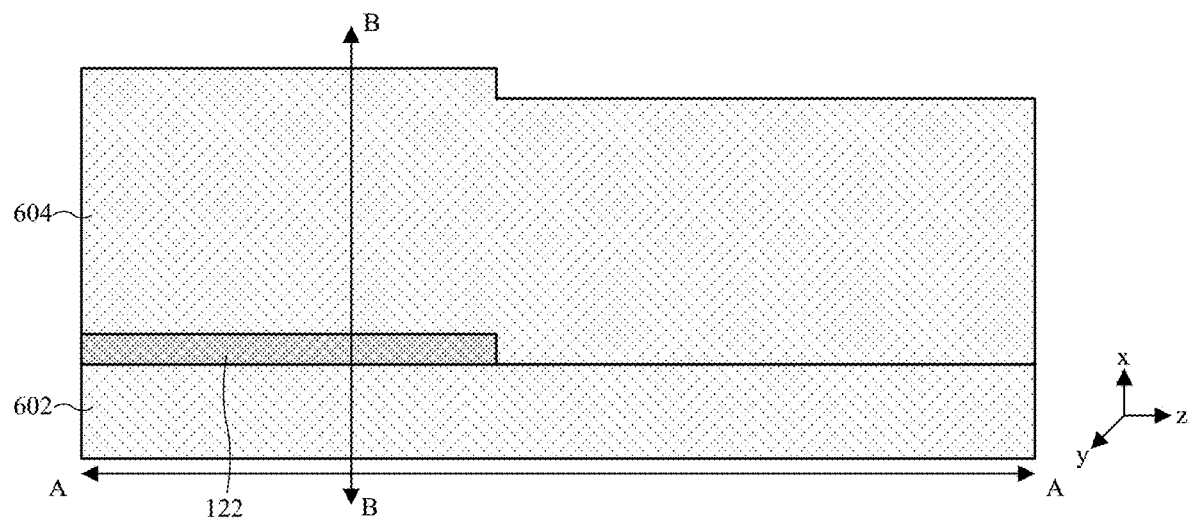
Figure 13B:
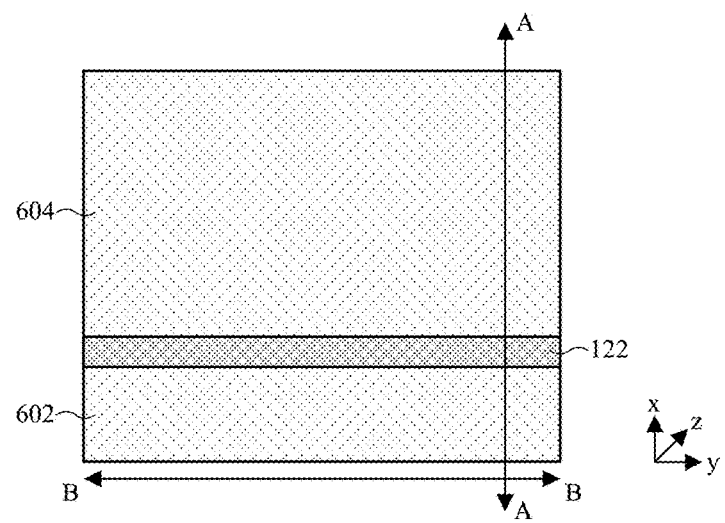

As shown in FIGS. 13A-13B, a second epitaxial structure 604 is formed over the base substrate 602 and the first epitaxial structure 122. In some embodiments, the second epitaxial structure 604 has the first doping type. In further embodiments, a process for forming the second epitaxial structure 604 comprises growing the second epitaxial structure 604 on the base substrate 602 and the first epitaxial structure 122 via a second epitaxial process. The second epitaxial process may be, for example, a vapor-phase epitaxial process, a liquid-phase epitaxial process, a molecular-beam epitaxial process, some other epitaxial process, or a combination of the foregoing. In further embodiments, the second epitaxial structure 604 is in-situ doped with the first doping type dopants (e.g., doped with the first doping type dopants as the second epitaxial structure 604 is grown via the second epitaxial process), such that the second epitaxial structure 604 is formed with a fourth doping concentration of the first doping type dopants. For example, during the second epitaxial process, a dopant gas (e.g., diborane) is flowed into a process chamber at a second predefined rate as the second epitaxial structure 604 is being formed, thereby forming the second epitaxial structure 604 with the fourth doping concentration of first doping type dopants. In further embodiments, the second predefined rate is less than the first predefined rate. In yet further embodiments, the fourth doping concentration of the first doping type dopants is substantially the same as the third doping concentration of the first doping type dopants.

Figure 14A:
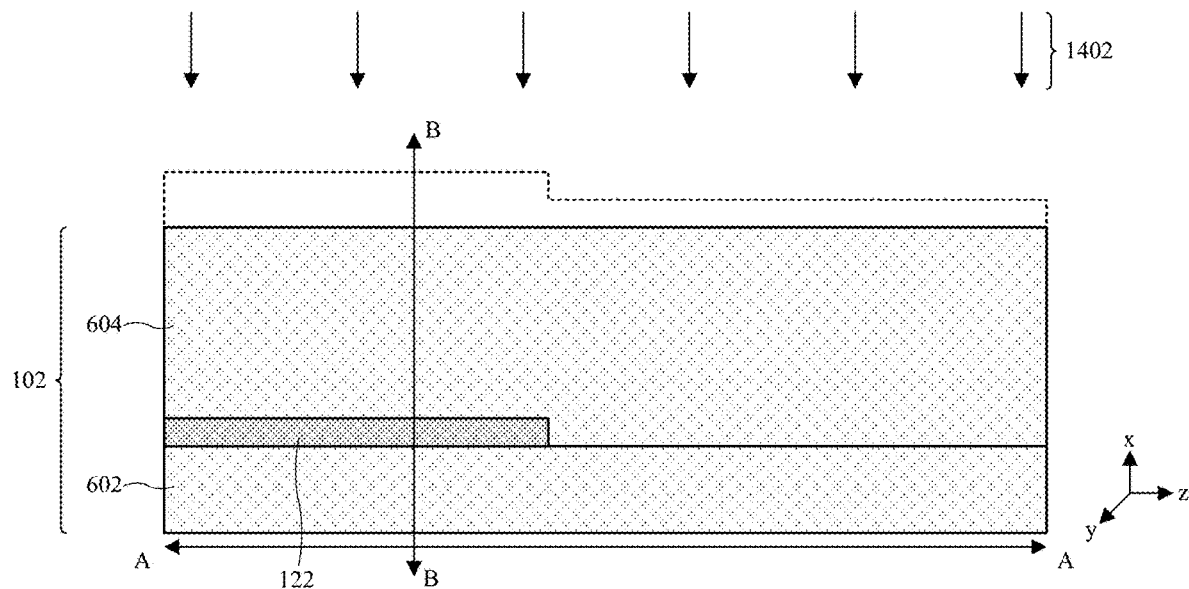
Figure 14B:
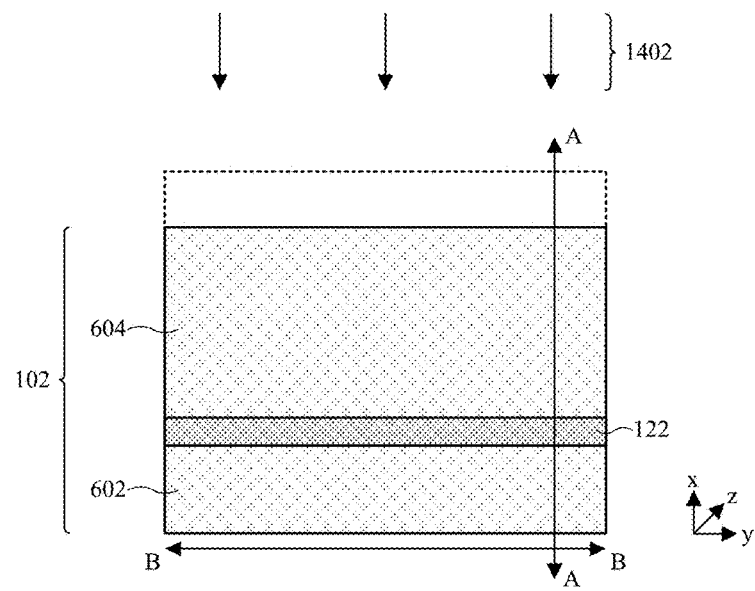

As shown in FIGS. 14A-14B, an upper portion of the second epitaxial structure 604 is removed (illustrated in FIGS. 14A-14B by a dashed line). In some embodiments, a process for removing the upper portion of the second epitaxial structure 604 comprising performing a polishing process 1402 (e.g., chemical mechanical polishing (CMP)) into the second epitaxial structure 604. The polishing process 1402 planarizes an upper surface of the second epitaxial structure 604. In further embodiments, the base substrate 602 may be referred to as a first portion of the semiconductor substrate 102, and the second epitaxial structure 604 may be referred to as a second portion of the semiconductor substrate 102. In yet further embodiments, after the polishing process 1402 is performed, the second epitaxial structure 604 and the base substrate 602 form a semiconductor substrate 102.

Figure 15A:
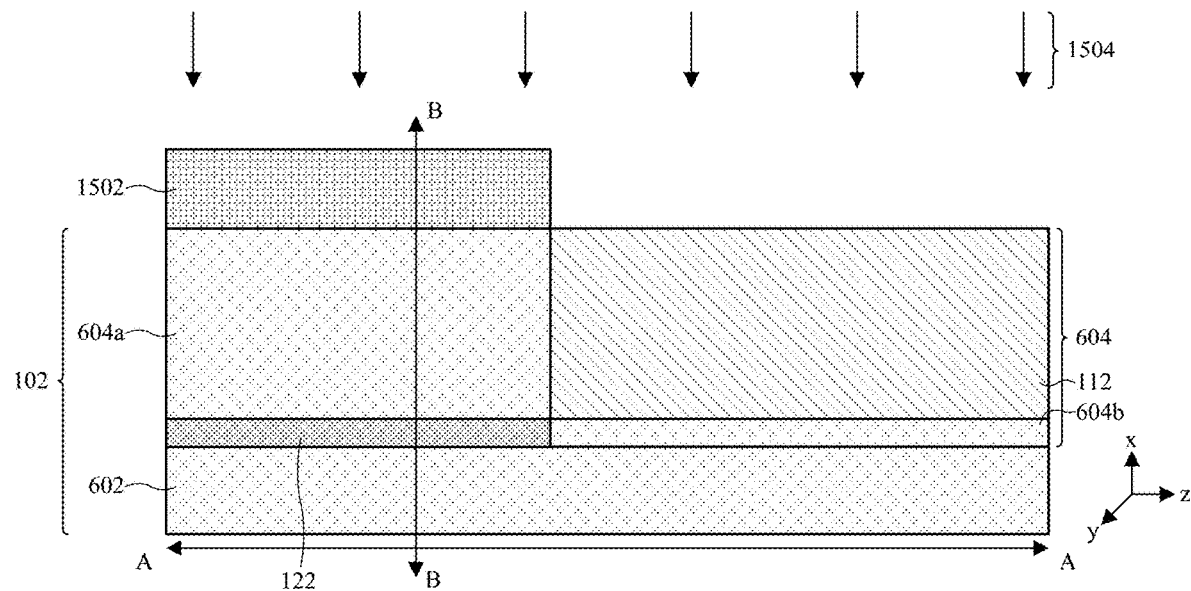
Figure 15B:
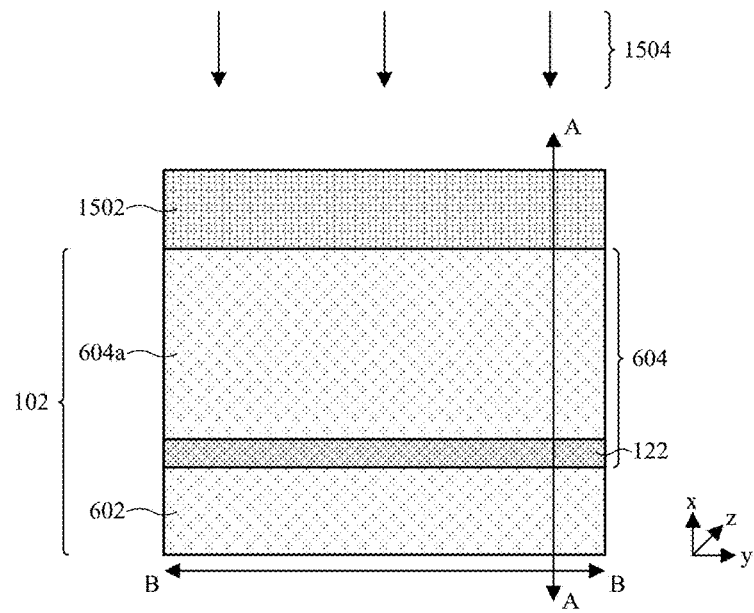

As shown in FIGS. 15A-15B, a second doped region 112 is formed in the semiconductor substrate 102. The second doped region 112 may be formed vertically spaced from an upper surface of the base substrate 602. In other embodiments, the second doped region 112 may be formed extending vertically into the base substrate 602. In some embodiments, the second doped region 112 extends vertically through the semiconductor substrate 102 from an upper surface of the second epitaxial structure 604 to a location that is substantially aligned with an upper surface of the first epitaxial structure 122. In other embodiments, the second doped region 112 extends vertically through the semiconductor substrate 102 from the upper surface of the second epitaxial structure 604 to a location disposed below the upper surface of the first epitaxial structure 122. In further embodiments, the second doped region 112 may be formed vertically spaced from the upper surface of the second epitaxial structure 604.

In some embodiments, a process for forming the second doped region 112 comprises forming a second patterned masking layer 1502 on the second epitaxial structure 604. Thereafter, a first implantation process 1504 (e.g., an ion implantation process) is performed to implant second doping type dopants (e.g., n-type dopants, such as phosphorus atoms, arsenic atoms, or the like) into the semiconductor substrate 102, thereby forming the second doped region 112. Subsequently, the second patterned masking layer 1502 may be stripped away.

In some embodiments, after the second doped region 112 is formed in the second epitaxial structure 604, the second epitaxial structure 604 comprises a first portion 604a and a second portion 604b. The first portion 604a of the second epitaxial structure 604 is disposed on a side of the second doped region 112 and over the first epitaxial structure 122. The second portion 604b of the second epitaxial structure 604 is disposed vertically between the second doped region 112 and the base substrate 602 and on a side of the first epitaxial structure 122. It will be appreciated that, the second doped region 112 is disposed in a third portion of the second epitaxial structure 604 (not illustrated in FIGS. 15A-15B for clarity) that is separated from the base substrate 602 by the second portion 604b of the second epitaxial structure 604.

Figure 16A:
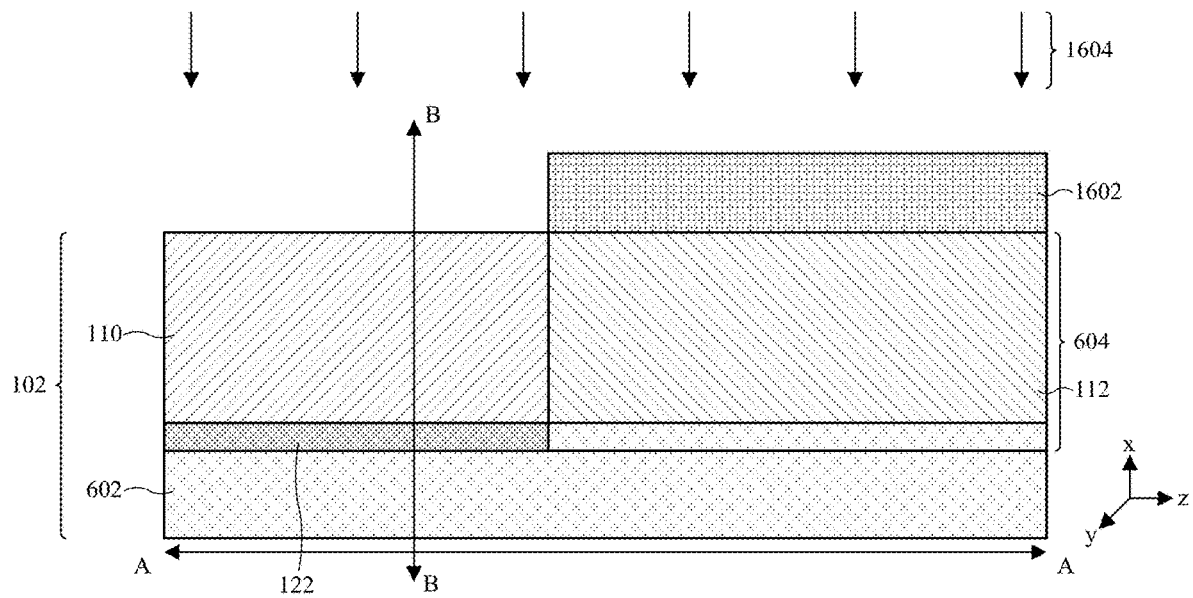
Figure 16B:
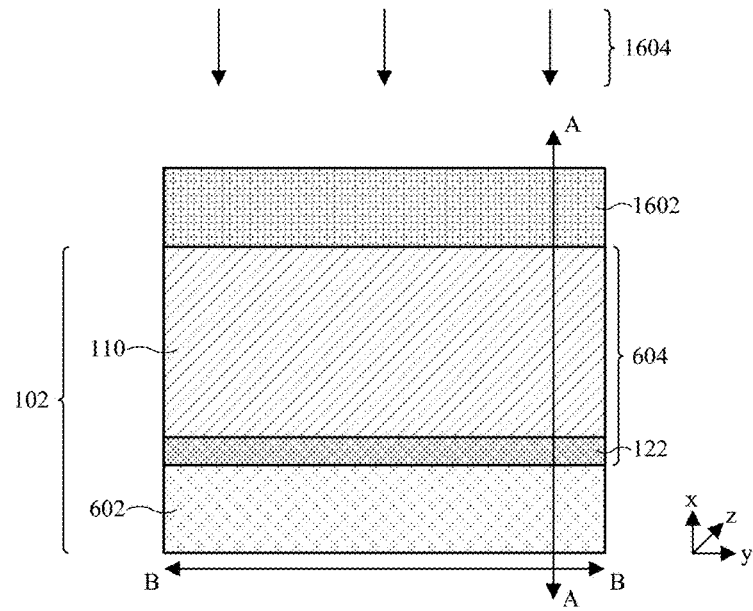

As shown in FIGS. 16A-16B, a first doped region 110 is formed in the semiconductor substrate 102. The first doped region 110 is formed directly over the first epitaxial structure 122. In other words, the first doped region 110 is formed in the first portion 604a of the second epitaxial structure 604 (not illustrated in FIGS. 16A-16B for clarity). In some embodiments, the first doped region 110 is formed in contact with the first epitaxial structure 122. In further embodiments, the first doped region 110 may extend vertically from the upper surface of the second epitaxial structure 604 into the semiconductor substrate 102. In other embodiments, the first doped region 110 may be formed vertically spaced from the upper surface of the second epitaxial structure 604.

In some embodiments, a process for forming the first doped region 110 comprises forming a third patterned masking layer 1602 on the second epitaxial structure 604. Thereafter, a second implantation process 1604 (e.g., an ion implantation process) is performed to implant the first doping type dopants (e.g., p-type dopants, such as boron atoms, aluminum atoms, or the like) into the semiconductor substrate 102, thereby forming the first doped region 110. Subsequently, the third patterned masking layer 1602 may be stripped away. It will be appreciated that, in some embodiments, the first doped region 110 may be formed before the second doped region 112.

Figure 17A:
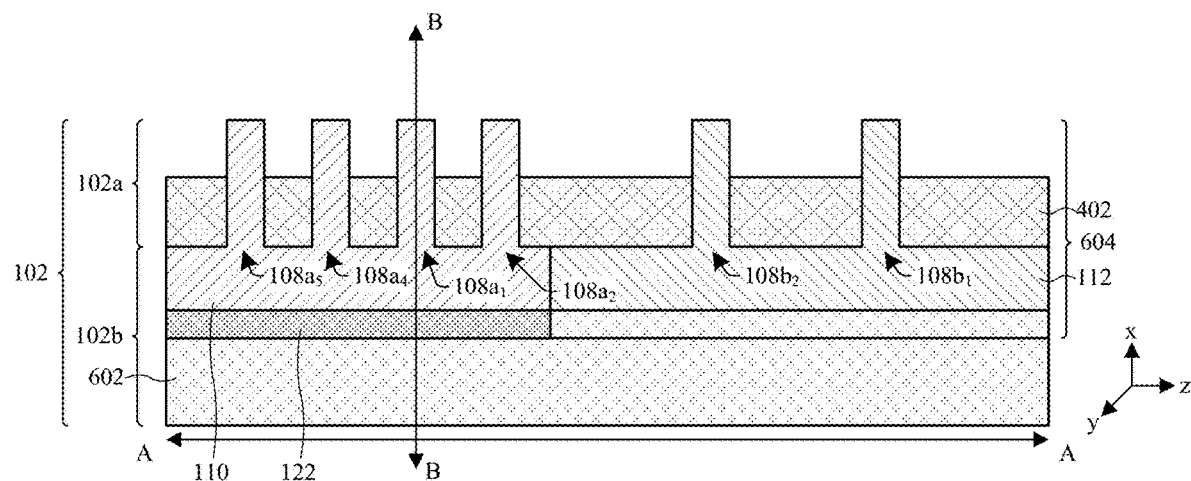
Figure 17B:
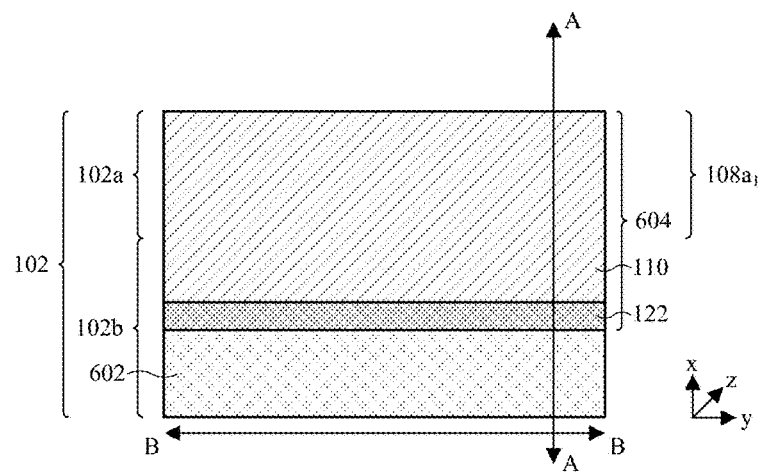

As shown in FIGS. 17A-17B, a plurality of fins 108 are formed over the base substrate 602. A first set of fins 108a are formed directly over the first epitaxial structure 122, and a second set of fins 108b are formed next to the first set of fins 108a. In some embodiments, a process for forming the fins 108 comprises forming a patterned masking layer (not shown) (e.g., a hardmask) on the second epitaxial structure 604. Thereafter, an etching process is performed on the second epitaxial structure 604 to form recesses in the second epitaxial structure 604, thereby leaving portions of the second epitaxial structure 604 that are masked by the patterned masking layer in place as the fins 108. The etching process may be a dry etching process, a wet etching process, a reactive ion etching process, some other etching process, or a combination of the foregoing. In further embodiments, the fins 108 may be formed using a mandrel-spacer double patterning process, some other multiple patterning process, or a combination of the foregoing. In yet further embodiments, after the fins 108 are formed, the semiconductor substrate 102 may comprise an upper region 102a of the semiconductor substrate 102 and a lower region 102b of the semiconductor substrate 102.

Also shown in FIGS. 17A-17B, an isolation structure 402 is formed over the lower region 102b of the semiconductor substrate 102. In some embodiments, a process for forming the isolation structure 402 comprise depositing an isolation layer (not shown) on the upper region 102a of the semiconductor substrate 102 and covering the fins 108. In further embodiments, the isolation layer may be deposited by, for example, chemical vapor deposition (CVD), physical vapor deposition (PVD), atomic layer deposition (ALD), thermal oxidation, some other deposition process, or a combination of the foregoing. A CMP process is then performed to remove an upper portion of the isolation layer. The CMP process may also remove the patterned masking layer on the second epitaxial structure 604. Thereafter, an etching process is performed on the isolation layer to recess the isolation layer below upper surfaces of the fins 108, thereby forming the isolation structure 402. In some embodiments, the etching process is more selective to the isolation layer than the fins 108.

Figure 18A:
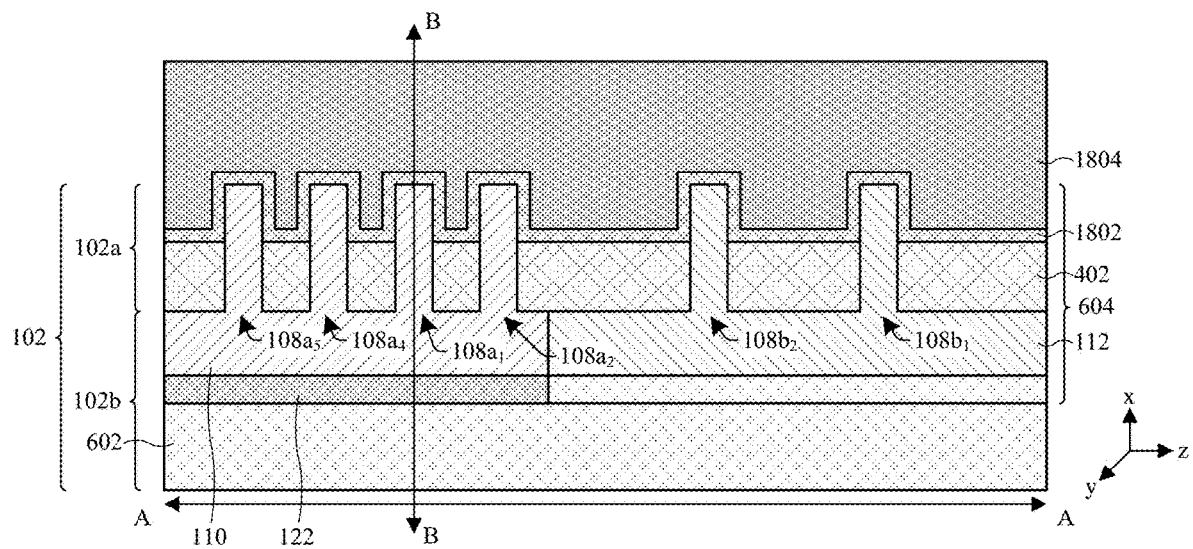
Figure 18B:
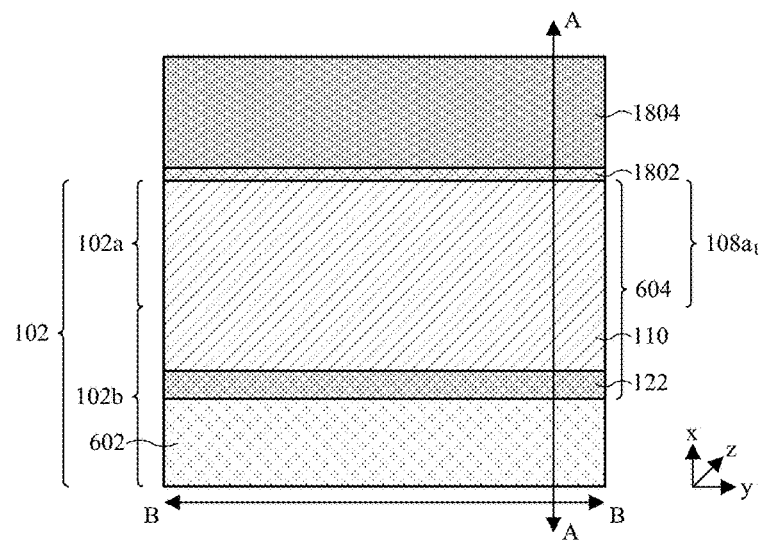

As shown in FIGS. 18A-18B, a gate dielectric layer 1802 is formed over the isolation structure 402 and covering the fins 108. In some embodiments, the gate dielectric layer 1802 is a continuous layer that extends across the isolation structure 402 and engages each of the fins 108 on three sides. In further embodiments, the gate dielectric layer 1802 comprises an oxide (e.g., $SiO_2$), a high-k dielectric (e.g., a dielectric material with a dielectric constant greater than 3.9), some other dielectric material, or a combination of the foregoing. The gate dielectric layer 1802 may comprise multiple layers, for example, comprising one or more interfacial layers. In yet further embodiments, a process for forming the gate dielectric layer 1802 comprises depositing the gate dielectric layer 1802 on the isolation structure and the fins 108 by, for example, CVD, PVD, ALD, some other deposition process, or a combination of the foregoing.

Also shown in FIGS. 18A-18B, a gate electrode layer 1804 is formed over the gate dielectric layer 1802. In further embodiments, the gate electrode layer 1804 comprises, for example, polysilicon, a metal (e.g., W), some other conductive material, or a combination of the foregoing. The gate electrode layer 1804 may comprise multiple layers. For example, in some embodiments, the gate electrode layer 1804 may comprise, for example, a work function metal layer and a metal fill layer. In yet further embodiments, a process for forming the gate electrode layer 1804 comprises depositing the gate electrode layer 1804 on the gate dielectric layer 1802 by, for example, CVD, PVD, ALD, sputtering, electrochemical plating, electroless plating, some other deposition process, or a combination of the foregoing.

Figure 19A:
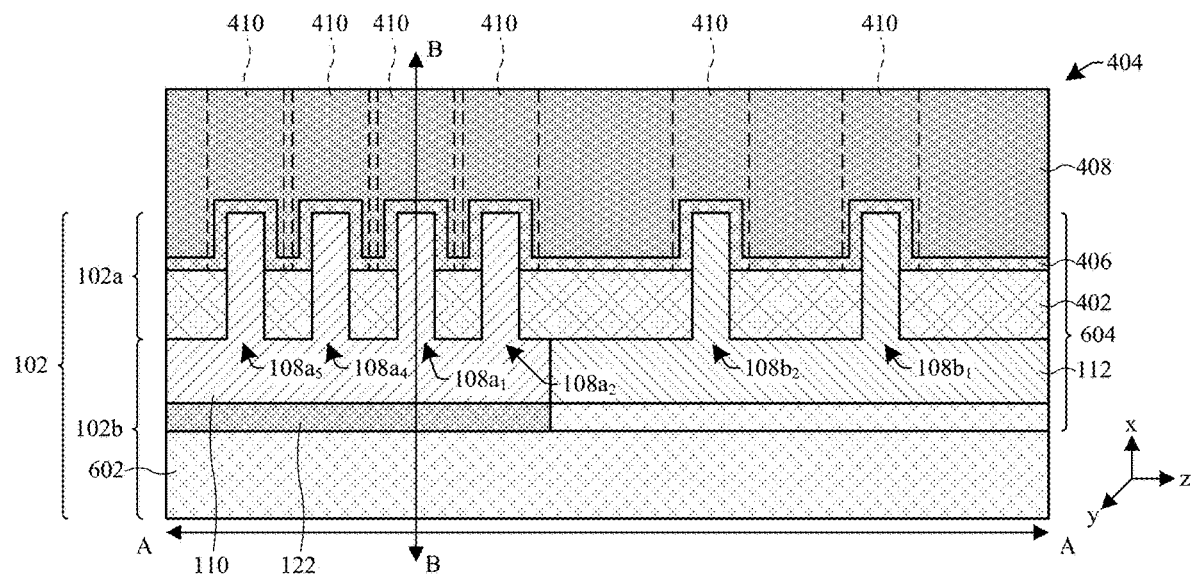
Figure 19B:
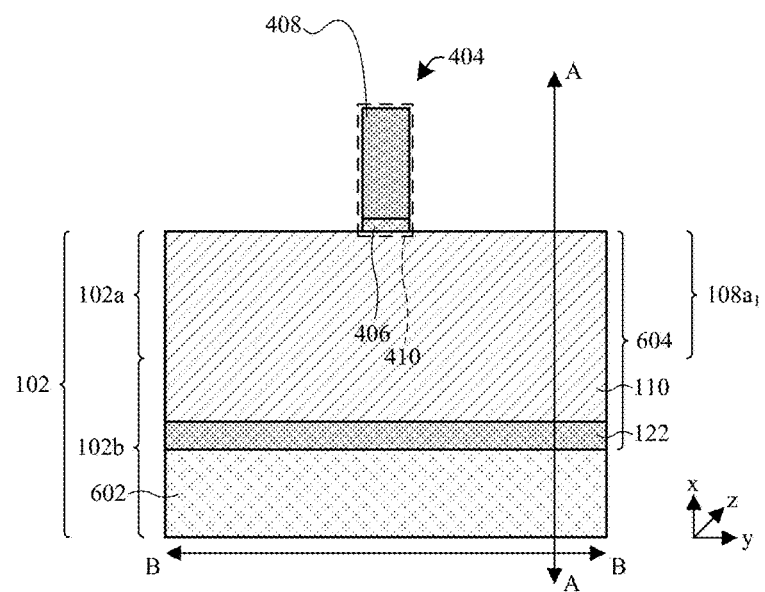

As shown in FIGS. 19A-19B, a continuous gate structure 404 is formed over the isolation structure 402 and over the fins 108. The continuous gate structure 404 comprises a continuous gate dielectric structure 406 and a continuous gate electrode structure 408. Further, the continuous gate structure 404 comprises a plurality of gate structures 410.

In some embodiments, a process for forming the continuous gate structure 404 comprises forming a patterned masking layer (not shown) (e.g., a hardmask) on the gate electrode layer 1804 (see, e.g., FIGS. 18A-18B). Thereafter, an etching process is performed on the gate electrode layer 1804 and the gate dielectric layer 1802 (see, e.g., FIGS. 18A-18B) to remove unmasked portions of the gate electrode layer 1804 and unmasked portions of the gate dielectric layer 1802, thereby forming the continuous gate electrode structure 408 and the continuous gate dielectric structure 406, respectively. The etching process may be a dry etching process, a wet etching process, a reactive ion etching process, some other etching process, or a combination of the foregoing.

Figure 20A:
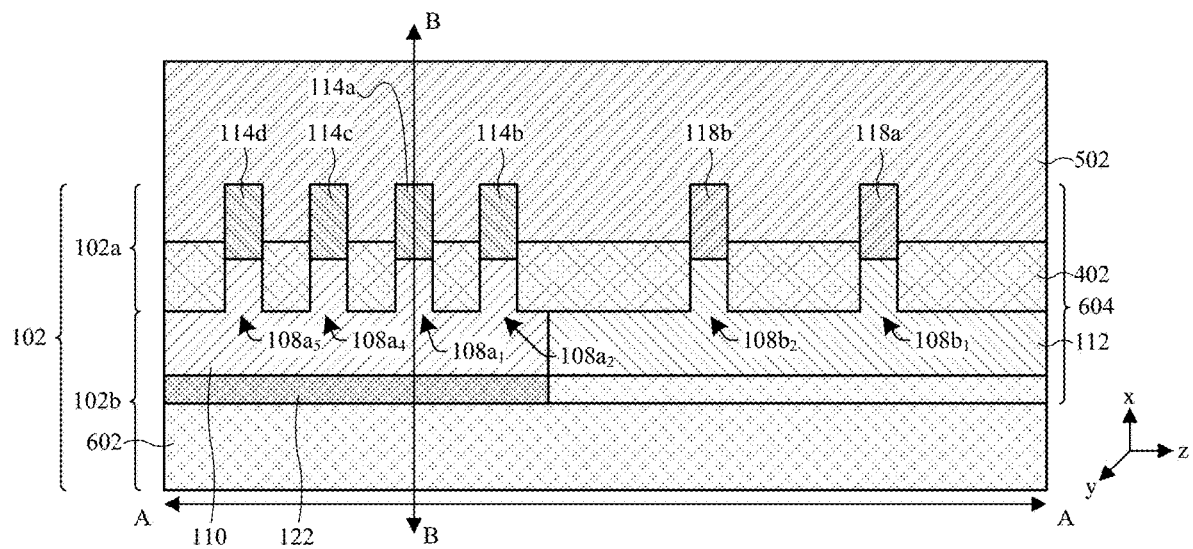
Figure 20B:
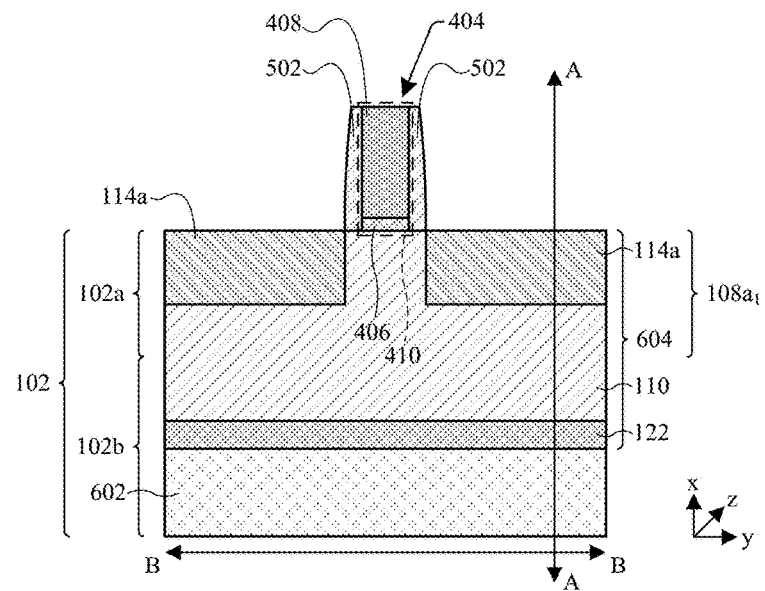

As shown in FIGS. 20A-20B, a sidewall spacer 502 is formed on opposite sidewalls of the continuous gate structure 404. The sidewall spacer 502 extends vertically along opposite sidewalls of the continuous gate dielectric structure 406 and opposite sidewalls of the continuous gate electrode structure 408. In some embodiments, the sidewall spacer 502 laterally extends continuously across the isolation structure 402 and over the fins 108 (along the "z" direction).

In some embodiments, a process for forming the sidewall spacer 502 comprises depositing a spacer layer (not shown) over the isolation structure 402, over the fins 108, and over the continuous gate structure 404. In further embodiments, the spacer layer may be deposited by PVD, CVD, ALD, sputtering, or the like. The spacer layer is subsequently etched to remove the spacer layer from horizontal surfaces, leaving the spacer layer along opposite sidewalls of the continuous gate structure 404, as the sidewall spacer 502. In yet further embodiments, the spacer layer may comprise, for example, a nitride (e.g., SiN), an oxy-nitride (e.g., $SiO_xN_y$), or the like.

Also shown in FIGS. 20A-20B, a pair of first source/drain regions 114 are formed on/in each of the fins 108 of the first set of fins 108a, and a pair of second source/drain regions 118 are formed on/in each of the fins 108 of the second set of fins 108b. In some embodiments, a process for forming the first source/drain regions 114 and the second source/drain regions 118 comprises performing an etching process on the fins 108 to form recesses that are disposed on opposite sides of the continuous gate structure 404 in each of the fins 108. In some embodiments, the etching process may be a dry etching process, a wet etching process, some other suitable etching process, or a combination of the foregoing.

Thereafter, a first epitaxial processes is performed to grow the first source/drain regions 114 from the recesses disposed on the fins 108 of the first set of fins 108a. The first epitaxial process may be, for example, a vapor-phase epitaxial process, a liquid-phase epitaxial process, a molecular-beam epitaxial process, some other epitaxial process, or a combination of the foregoing. In some embodiments, the first epitaxial processes may in-situ doped the first source/drain regions 114 with the second doping type dopants (e.g., n-type dopants). A second epitaxial process is then performed to grow the second source/drain regions 118 from the recesses disposed on the fins 108 of the second set of fins 108b. The second epitaxial process may be, for example, a vapor-phase epitaxial process, a liquid-phase epitaxial process, a molecular-beam epitaxial process, some other epitaxial process, or a combination of the foregoing. In some embodiments, the second epitaxial processes may in-situ doped the second source/drain regions 118 with the first doping type dopants (e.g., p-type dopants). It will be appreciated that the first source/drain regions 114 and the second source/drain regions 118 may be formed by other suitable processes (e.g., forming the first source/drain regions 114 and the second source/drain regions 118 on/in corresponding fins 108 by one or more ion implantation processes).

Figure 21A:
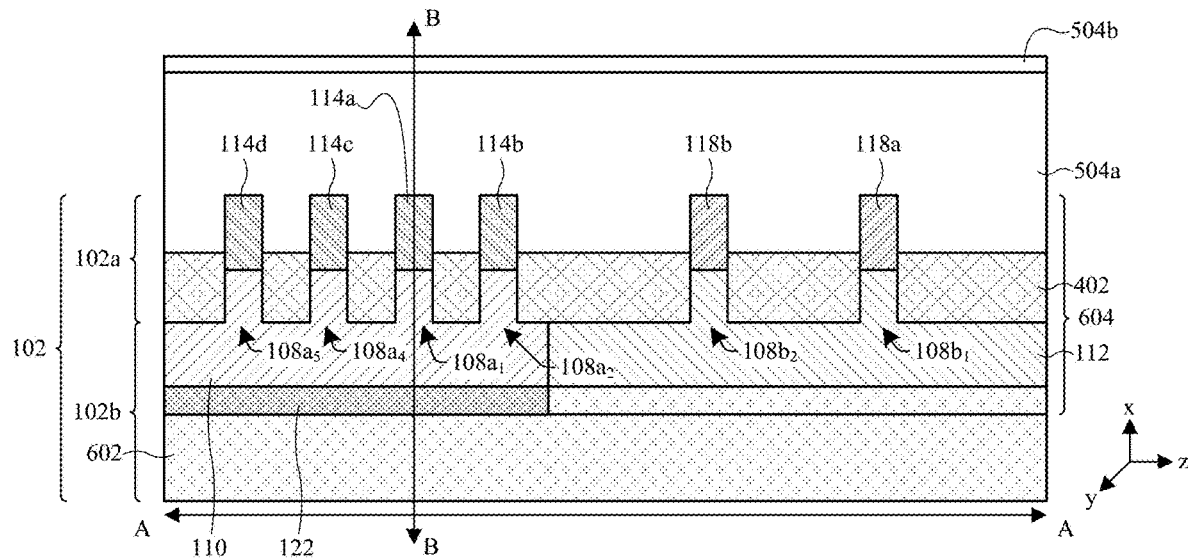
Figure 21B:
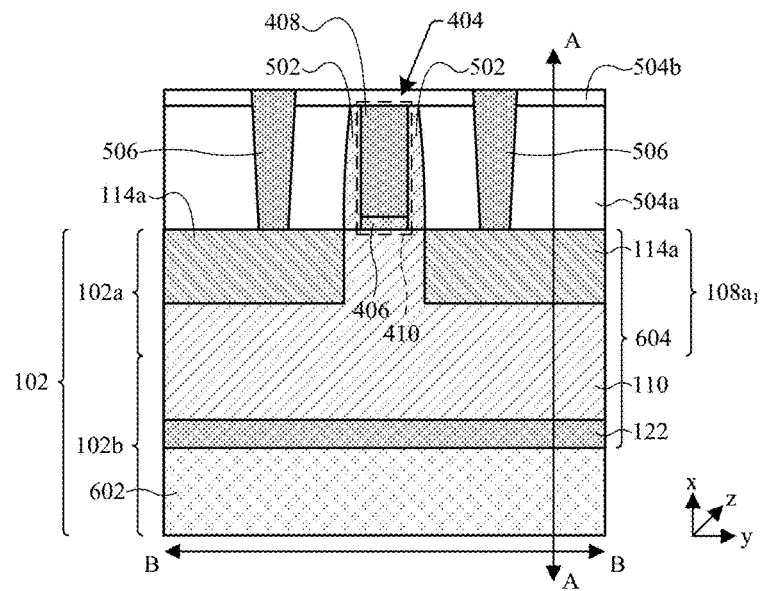

As shown in FIGS. 21A-21B, a first interlayer dielectric (ILD) structure 504a is formed over the isolation structure 402, the fins 108, the first source/drain regions 114, and the second source/drain regions 118. In some embodiments, a process for forming the first ILD structure 504a comprises depositing a first ILD layer on the isolation structure 402 and covering the continuous gate structure 404, the sidewall spacer 502, the fins 108, the first source/drain regions 114, and the second source/drain regions 118. Thereafter, a planarization process (e.g., CMP) is performed on the first ILD layer to remove an upper portion of the first ILD layer, thereby forming the first ILD structure 504a. In some embodiments, the first ILD structure 504a is formed with an upper surface that is substantially co-planar with an upper surface of the continuous gate electrode structure 408 and substantially co-planar with an upper surface of the sidewall spacer 502. It will be appreciated that, after the first ILD structure 504a is formed, in some embodiments, a replacement gate process may be performed to replace the continuous gate electrode structure 408 with a continuous metal gate electrode structure (e.g., via a high-k/metal gate replacement gate process).

Also shown in FIGS. 21A-21B, a second ILD structure 504b is formed over the first ILD structure 504a, the continuous gate structure 404, and the sidewall spacer 502. Further, a plurality of first conductive contacts 506 are formed over the fins 108 and in both the first ILD structure 504a and the second ILD structure 504b. The first conductive contacts 506 are formed over the semiconductor substrate 102 and extending vertically through the first ILD structure 504a and the second ILD structure 504b. In some embodiments, a process for forming the second ILD structure 504b and the first conductive contacts 506 comprises forming a second ILD layer on the first ILD structure 504a and covering the continuous gate structure 404 and the sidewall spacer 502. Thereafter, first contact openings are formed extending through the second ILD layer and through the first ILD structure 504a. A conductive material (e.g., W) is the formed on the second ILD layer and filling the first contact openings. Thereafter, a planarization process (e.g., CMP) is performed into the conductive material and the second ILD layer to form the first conductive contacts 506 and the second ILD structure 504b.

Figure 22A:
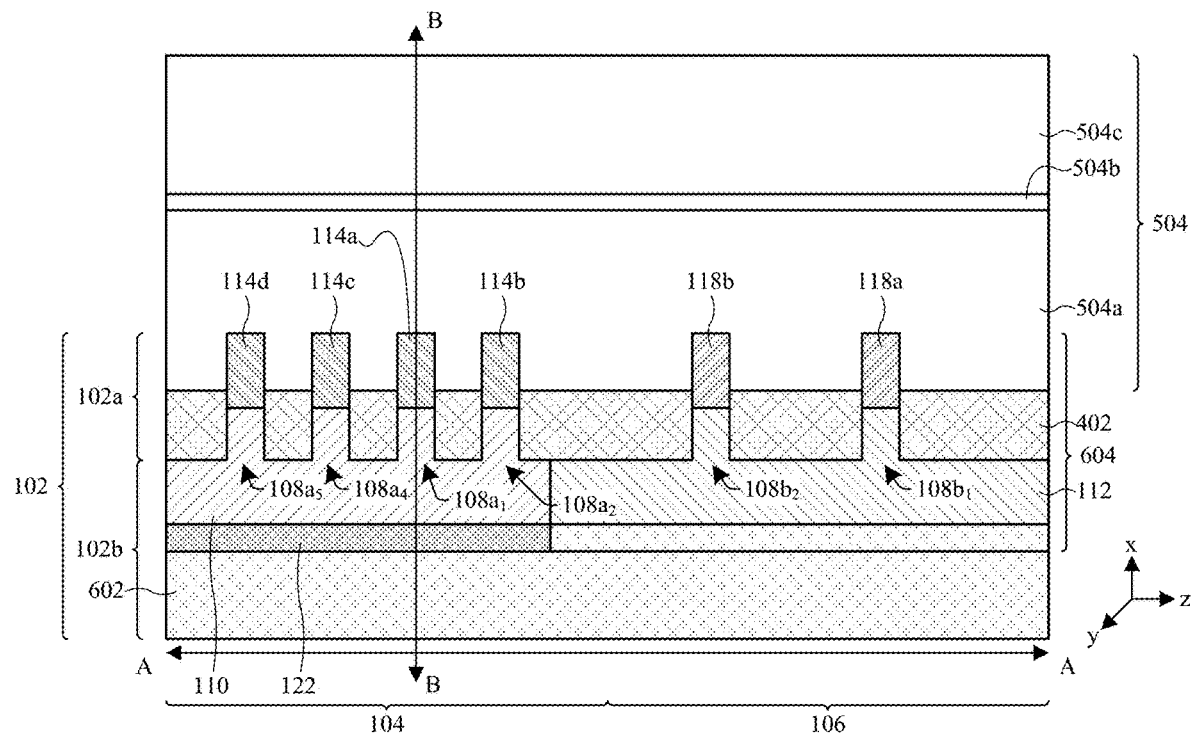
Figure 22B:
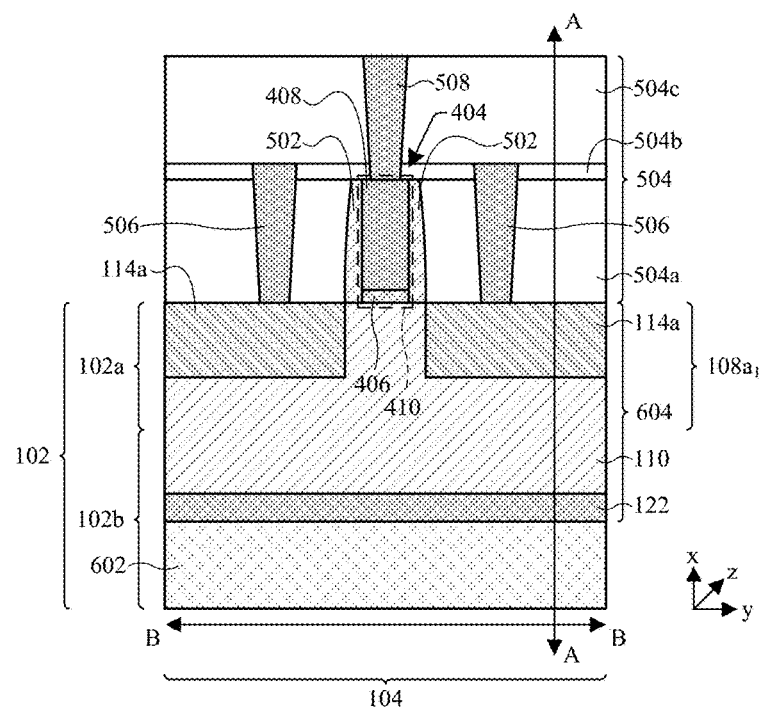

As shown in FIGS. 22A-22B, a third ILD structure 504c is formed over the second ILD structure 504b, and one or more second conductive contacts 508 are formed over the continuous gate structure 404. The one or more second conductive contacts 508 are formed extending vertically though the second ILD structure 504b and the third ILD structure 504c.

In some embodiments, a process for forming the third ILD structure 504c and the one or more second conductive contacts 508 comprises forming a third ILD layer on the second ILD structure 504b and covering the first conductive contacts 506. Thereafter, one or more second contact openings are formed extending through the third ILD layer and through the second ILD structure 504b. A conductive material (e.g., W) is the formed on the third ILD layer and filling the second contact openings. Thereafter, a planarization process (e.g., CMP) is performed into the conductive material and the third ILD layer to form the one or more second conductive contacts 508 and the third ILD structure 504c. While not shown, it will be appreciated that any number of additional ILD structures may be formed over the third ILD structure 504c and any number of other conductive features (e.g., metal lines, metal vias, etc.) may be formed in the additional ILD structures to form an interconnect structure (e.g., copper interconnect) that interconnects various semiconductor devices of the IC 100.

Figure 23:
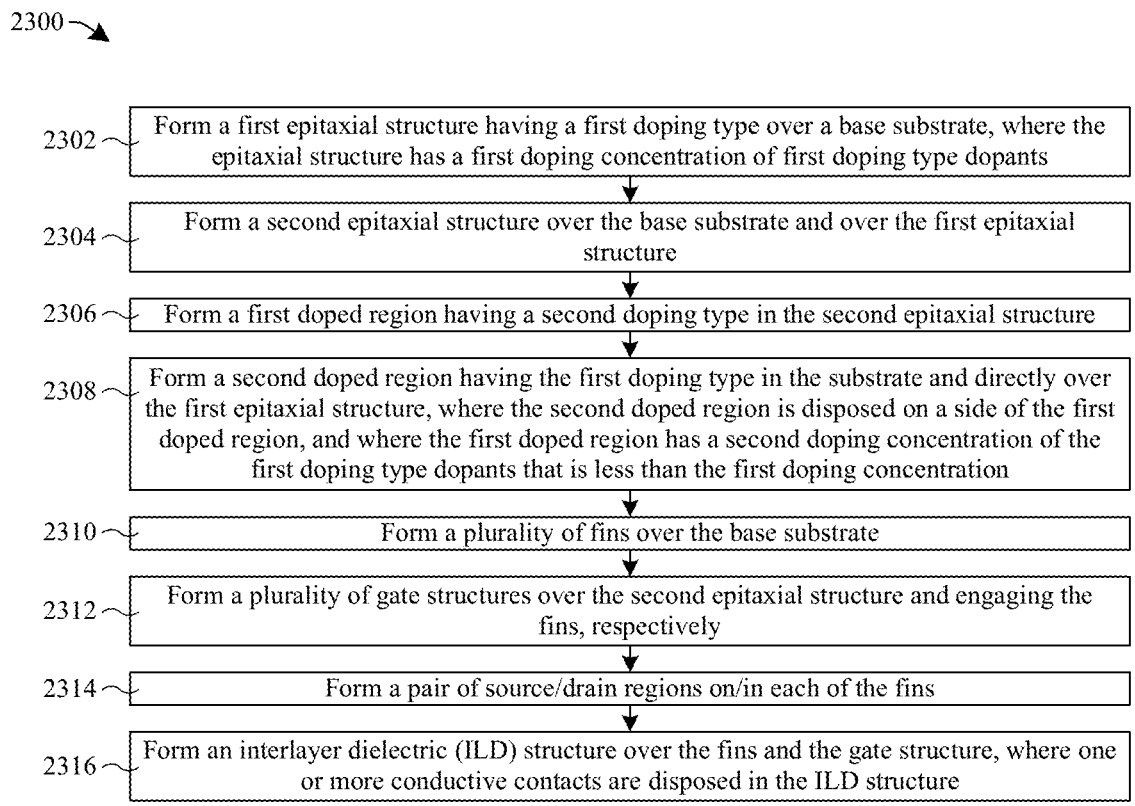
FIG. 23 illustrates a flowchart of some embodiments of a method for forming an IC having improved latch-up immunity.

FIG. 23 illustrates a flowchart of some embodiments of a method for forming an integrated chip (IC) having improved latch-up immunity. While the flowchart 2300 of FIG. 23 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 2302, a first epitaxial structure having a first doping type is formed over a base substrate, where the epitaxial structure has a first doping concentration of the first doping type dopants. FIGS. 11A-11B through FIGS. 12A-12B illustrate a series of various cross-sectional views of some embodiments corresponding to act 2302.

At act 2304, a second epitaxial structure is formed over the base substrate and over the first epitaxial structure. FIGS. 13A-13B through FIGS. 14A-14B illustrate a series of various cross-sectional views of some embodiments corresponding to act 2304.

At act 2306, a first doped region having a second doping type is formed in the second epitaxial structure. FIGS. 15A-15B illustrate various cross-sectional view of some embodiments corresponding to act 2306.

At act 2308, a second doped region having the first doping type is formed in the substrate and directly over the first epitaxial structure, where the second doped region is disposed on a side of the first doped region, and where the first doped region has a second doping concentration of the first doping type dopants that is less than the first doping concentration. FIGS. 16A-16B illustrate various cross-sectional view of some embodiments corresponding to act 2308.

At act 2310, a plurality of fins are formed over the base substrate. FIGS. 17A-17B illustrate various cross-sectional view of some embodiments corresponding to act 2310.

At act 2312, a plurality of gate structures are formed over the second epitaxial structure and engaging the fins, respectively. FIGS. 18A-18B through FIGS. 19A-19B illustrate a series of various cross-sectional views of some embodiments corresponding to act 2312.

At act 2314, a pair of source/drain regions are formed on/in each of the fins. FIGS. 20A-20B illustrate various cross-sectional view of some embodiments corresponding to act 2314.

At act 2316, an interlayer dielectric (ILD) structure is formed over the fins and the gate structure, where one or more conductive contacts are disposed in the ILD structure. FIGS. 21A-21B through FIGS. 22A-22B illustrate a series of various cross-sectional views of some embodiments corresponding to act 2316.

In some embodiments, the present application provides method for forming an integrated chip (IC). The method comprises receiving a first portion of a semiconductor substrate, wherein the first portion of the semiconductor substrate has a first region and has a second region disposed on a first side of the first region. An epitaxial structure having a first doping type is formed directly over the first region of the first portion of the semiconductor substrate. A second portion of the semiconductor substrate is formed over the epitaxial structure, the first region of the of the first portion of the semiconductor substrate, and the second region of the first portion of the semiconductor substrate. A first doped region having the first doping type is formed in the second portion of the semiconductor substrate and directly over the epitaxial structure. A second doped region having a second doping type opposite the first doping type is formed in the second portion of the semiconductor substrate, wherein the second doped region is formed on a second side of the epitaxial structure. A plurality of fins of the semiconductor substrate are formed by selectively removing portions of the second portion of the semiconductor substrate, wherein one or more fins of the plurality of fins are disposed directly over the epitaxial structure and one or more other fins of the plurality of fins are disposed directly over the second region of the first portion of the semiconductor substrate.

In some embodiments, the present application provides an integrated chip (IC) comprising a first region and a second region disposed on a first side of the first region. The IC comprises a semiconductor substrate. A first fin of the semiconductor substrate is disposed in the first region of the IC. A second fin of the semiconductor substrate is disposed in the second region of the IC and laterally spaced from the first fin in a first direction. A first doped region is disposed in the semiconductor substrate and in the first region of the IC, wherein the first doped region has a first doping type. A second doped region is disposed in the semiconductor substrate and in the second region of the IC, wherein the second doped region has a second doping type opposite the first doping type. An epitaxial structure having the first doping type is disposed in the semiconductor substrate and contacting the first doped region, wherein the epitaxial structure is disposed in the first region of the IC and between the first doped region and a lower surface of the semiconductor substrate, and wherein the epitaxial structure has a higher doping concentration of first doping type dopants than the first doped region.

In some embodiments, the present application provides method for forming an integrated chip (IC). The method comprises forming an epitaxial structure having a first doping type directly over a first region of a first portion of a semiconductor substrate. A second portion of the semiconductor substrate is formed over the epitaxial structure and over the first portion of the semiconductor substrate, wherein the second portion of the semiconductor substrate contacts an upper surface of the epitaxial structure and an upper surface of a second region of the first portion of the semiconductor substrate, and wherein the second region of the first portion of the semiconductor substrate is disposed on a side of the epitaxial structure. A first doped region having the first doping type is formed in the second portion of the semiconductor substrate and directly over the epitaxial structure. A second doped region having a second doping type opposite the first doping type is formed in the second portion of the semiconductor substrate and directly over the second region of the first portion of the semiconductor substrate. A first fin of the semiconductor substrate and a second fin of the semiconductor substrate are formed by selectively removing portions of the second portion of the semiconductor substrate, wherein the first fin is formed directly over the epitaxial structure, and wherein the second fin is formed laterally spaced from the first fin and directly over the second region of the first portion of the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip (IC), the method comprising:
receiving a first portion of a semiconductor substrate, wherein the first portion of the semiconductor substrate has a first region and has a second region disposed on a first side of the first region of the first portion of the semiconductor substrate;

forming an epitaxial structure having a first doping type directly over the first region of the first portion of the semiconductor substrate;

forming a second portion of the semiconductor substrate over the epitaxial structure, the first region of the first portion of the semiconductor substrate, and the second region of the first portion of the semiconductor substrate;

forming a first doped region having the first doping type in the second portion of the semiconductor substrate and directly over the epitaxial structure;

forming a second doped region having a second doping type opposite the first doping type in the second portion of the semiconductor substrate, wherein the second doped region is formed on a second side of the epitaxial structure; and forming a plurality of fins of the semiconductor substrate by selectively removing portions of the second portion of the semiconductor substrate, wherein one or more fins of the plurality of fins are disposed directly over the epitaxial structure and one or more other fins of the plurality of fins are disposed directly over the second region of the first portion of the semiconductor substrate, wherein after the plurality of fins are formed, a first upper surface of the second portion of the semiconductor substrate is substantially planar and the first upper surface of the second portion of the semiconductor substrate extends laterally between a first fin of the one or more fins of the plurality of fins and a first fin of the one or more other fins of the plurality of fins, and wherein the first upper surface of the second portion of the semiconductor substrate partially overlies both the first doped region and the second doped region.

2. The method of claim 1, wherein forming the epitaxial structure comprises:

growing an epitaxial layer on an upper surface of the first portion of the semiconductor substrate via an epitaxial process, wherein the epitaxial layer is formed as a continuous layer that extends across both the first region of the first portion of the semiconductor substrate and the second region of the first portion of the semiconductor substrate;

forming a patterned masking layer on the epitaxial layer that covers a third portion of the epitaxial layer, wherein the third portion of the epitaxial layer is disposed directly over the first region of the first portion of the semiconductor substrate; and with the patterned masking layer in place, removing a fourth portion of the epitaxial layer that is disposed directly over the second region of the first portion of the semiconductor substrate, thereby leaving the third portion of the epitaxial layer in place as the epitaxial structure.

3. The method of claim 2, wherein the epitaxial layer is in-situ doped with first doping type dopants during the epitaxial process, such that the epitaxial layer has a first doping concentration of the first doping type dopants.

4. The method of claim 3, wherein forming the first doped region comprises:

after the epitaxial structure is formed, performing an implantation process to implant the first doping type dopants into the second portion of the semiconductor substrate, such that the first doped region has a second doping concentration of the first doping type dopants that is less than the first doping concentration.

5. A method for forming an integrated chip (IC), the method comprising:

forming an epitaxial structure having a first doping type directly over a first region of a first portion of a semiconductor substrate;

forming a second portion of the semiconductor substrate over the epitaxial structure and over the first portion of the semiconductor substrate, wherein the second portion of the semiconductor substrate contacts an upper surface of the epitaxial structure and an upper surface of a second region of the first portion of the semiconductor substrate, and wherein the second region of the first portion of the semiconductor substrate is disposed on a side of the epitaxial structure;

forming a first doped region having the first doping type in the second portion of the semiconductor substrate and directly over the epitaxial structure;

forming a second doped region having a second doping type opposite the first doping type in the second portion of the semiconductor substrate and directly over the second region of the first portion of the semiconductor substrate; and forming a first fin of the semiconductor substrate and a second fin of the semiconductor substrate by selectively removing portions of the second portion of the semiconductor substrate, wherein:

the first fin is formed directly over the epitaxial structure;

the second fin is formed laterally spaced from the first fin and directly over the second region of the first portion of the semiconductor substrate;

after the first fin and the second fin are formed, a substantially planar upper surface of the second portion of the semiconductor substrate extends laterally between the first fin and the second fin;

a first vertical plane intersect the first region of the first portion of the semiconductor substrate, the epitaxial structure, and the upper surface of the second portion of the semiconductor substrate;

a second vertical plane intersects the second region of the first portion of the semiconductor substrate and the upper surface of the second portion of the semiconductor substrate;

the first vertical plane extends vertically in parallel with the second vertical plane;

a sidewall of the epitaxial structure is spaced laterally from the first vertical plane in a first direction and laterally from the second vertical plane in a second direction opposite the first direction; and a distance along the first vertical plane from a lower surface of the first portion of the semiconductor substrate to the upper surface of the second portion of the semiconductor substrate is substantially the same as a distance along the second vertical plane from the lower surface of the first portion of the semiconductor substrate to the upper surface of the second portion of the semiconductor substrate.

6. A method for forming an integrated chip (IC), the method comprising:

forming an epitaxial structure having a first doping type directly over a first region of a first portion of a semiconductor substrate;

forming a second portion of the semiconductor substrate over the epitaxial structure and over the first portion of the semiconductor substrate, wherein the second portion of the semiconductor substrate contacts an upper surface of the epitaxial structure and an upper surface of a second region of the first portion of the semiconductor substrate, wherein the second region of the first portion of the semiconductor substrate is disposed on a side of the epitaxial structure, wherein the second portion of the semiconductor substrate is formed with a first upper surface disposed directly over the epitaxial structure and a second upper surface disposed directly over the second region of the first portion of the semiconductor substrate, wherein the first upper surface is disposed over the second upper surface, and wherein forming the second portion of the semiconductor substrate comprises growing the second portion of the semiconductor substrate on both the epitaxial structure and the second region of the first portion of the semiconductor substrate by a first epitaxial process;

forming a first doped region having the first doping type in the second portion of the semiconductor substrate and directly over the epitaxial structure;

forming a second doped region having a second doping type opposite the first doping type in the second portion of the semiconductor substrate and directly over the second region of the first portion of the semiconductor substrate;

forming a first fin of the semiconductor substrate and a second fin of the semiconductor substrate by selectively removing portions of the second portion of the semiconductor substrate, wherein the first fin is formed directly over the epitaxial structure, and wherein the second fin is formed laterally spaced from the first fin and directly over the second region of the first portion of the semiconductor substrate; and before the first fin or the second fin are formed, performing a planarization process into the second portion of the semiconductor substrate to planarize the first upper surface and the second upper surface into a substantially planar third upper surface of the second portion of the semiconductor substrate.

7. The method of claim 5, wherein:

forming the epitaxial structure comprises growing an epitaxial layer on the first portion of the semiconductor substrate by an epitaxial process, wherein the epitaxial layer is in-situ doped with first doping type dopants during the epitaxial process, such that the epitaxial layer has a first doping concentration of the first doping type dopants; and forming the first doped region comprises performing an implantation process to implant the first doping type dopants into the second portion of the semiconductor substrate, such that the first doped region has a second doping concentration of the first doping type dopants that is less than the first doping concentration.

8. The method of claim 1, wherein the second portion of the semiconductor substrate has a first region that overlies the epitaxial structure and overlies the first region of the first portion of the semiconductor substrate, and wherein the second portion of the semiconductor substrate has a second region that overlies the second region of the first portion of the semiconductor substrate.

9. The method of claim 1, wherein:

forming the epitaxial structure comprises doping the epitaxial structure with first doping type dopants, such that the epitaxial structure has the first doping type; and the epitaxial structure is doped with the first doping type dopants before the second portion of the semiconductor substrate is formed.

10. The method of claim 9, wherein:

forming the first doped region comprises doping the first region of the second portion of the semiconductor substrate with the first doping type dopants, such that the first doped region has the first doping type;

forming the second doped region comprises doping the second region of the second portion of the semiconductor substrate with second doping type dopants, such that the second doped region has the second doping type; and the first doped region and the second doped region are formed before the plurality of fins are formed.

11. The method of claim 10, wherein:

the epitaxial structure is doped with the first doping type dopants such that the epitaxial structure has a first doping concentration of the first doping type dopants;

the first doped region is doped with the first doping type dopants such that the first doped region has a second doping concentration of the first doping type dopants; and a ratio of the first doping concentration to the second doping concentration is between 10:1 and 1000:1.

12. The method of claim 8, further comprising:

before the plurality of fins are formed, performing a planarization process on the second portion of the semiconductor substrate to planarize a second upper surface of the second portion of the semiconductor substrate.

13. The method of claim 12, wherein the first region of the second portion of the semiconductor substrate has an upper segment that is disposed over an uppermost surface of the second region of the second portion of the semiconductor substrate, and wherein the planarization process removes the upper segment of the first region of the second portion of the semiconductor substrate.

14. The method of claim 12, wherein both the first doped region and the second doped region are formed after the planarization process.

15. The method of claim 5, wherein:

the first fin neighbors the second fin; and both the first vertical plane and the second vertical plane are disposed laterally between the first fin and the second fin.

16. The method of claim 5, wherein:

the first region of the first portion of the semiconductor substrate is disposed on a first side of the sidewall of the epitaxial structure; and the second region of the first portion of the semiconductor substrate is disposed on a second side of the sidewall of the epitaxial structure opposite the first side of the sidewall of the epitaxial structure.

17. The method of claim 6, wherein the epitaxial structure is in-situ doped with first doping type dopants during the first epitaxial process.

18. The method of claim 17, wherein:

the second portion of the semiconductor substrate is formed via a second epitaxial process that is different than the first epitaxial process.

19. The method of claim 18, wherein both the first doped region and the second doped region are formed after the planarization process.

20. The method of claim 19, further comprising:

forming a first pair of source/drain regions on the first fin; and forming a second pair of source/drain regions on the second fin.

* * * * *